US006768161B2

(12) United States Patent
Kinoshita

(10) Patent No.: US 6,768,161 B2
(45) Date of Patent: Jul. 27, 2004

(54) SEMICONDUCTOR DEVICE HAVING FLOATING GATE AND METHOD OF PRODUCING THE SAME

(75) Inventor: Hideyuki Kinoshita, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 10/157,986

(22) Filed: May 31, 2002

(65) Prior Publication Data

US 2002/0179962 A1 Dec. 5, 2002

(30) Foreign Application Priority Data

Jun. 1, 2001 (JP) ........................................ 2001-166041

(51) Int. Cl.⁷ .......................................... H01L 29/780
(52) U.S. Cl. ................................................. 257/316
(58) Field of Search .................. 257/316, 314, 257/315, 317; 438/259

(56) References Cited

U.S. PATENT DOCUMENTS

| | | | | |
|---|---|---|---|---|
| 5,051,795 A | * | 9/1991 | Gill et al. ................ | 257/317 |
| 5,661,056 A | * | 8/1997 | Takeuchi ................ | 438/261 |
| 5,686,333 A | * | 11/1997 | Sato ........................ | 438/257 |
| 6,184,085 B1 | * | 2/2001 | Jeong ..................... | 438/258 |
| 6,232,632 B1 | * | 5/2001 | Liu .......................... | 257/315 |
| 6,246,089 B1 | * | 6/2001 | Lin et al. ................ | 257/315 |
| 6,362,045 B1 | * | 3/2002 | Lin et al. ................ | 438/257 |

FOREIGN PATENT DOCUMENTS

| JP | 2001-77333 | 3/2001 |
|---|---|---|
| JP | 2001-168306 | 6/2001 |

OTHER PUBLICATIONS

"Semiconductor Storage Device and its Manufacturing Method"; U.S. patent application No. 09/665,166, filed Sep. 20, 2000.

* cited by examiner

Primary Examiner—Carl Whitehead, Jr.
Assistant Examiner—Jennifer M Dolan
(74) Attorney, Agent, or Firm—Finnegan, Henderson, Farabow, Garrett & Dunner, L.L.P.

(57) ABSTRACT

A semiconductor memory device, having at least one floating gate, includes a semiconductor substrate; at least one device-isolation region buried in the semiconductor substrate, having a top surface protruding from a top surface of the semiconductor substrate, the top surface of the device isolation region having a concave section that has a depression thereon; at least one gate-insulating film formed on the semiconductor substrate; a first gate formed on the gate-insulating film, the device-isolation region and the depression; a gate-to-gate insulating film formed on the first gate and in the concave section and the depression of the device-isolation region; and a second gate formed on the gate-to-gate insulation film, the depression being filled with the second gate.

10 Claims, 18 Drawing Sheets

SEMICONDUCTOR DEVICE HAVING FLOATING GATE AND METHOD OF PRODUCING THE SAME

CROSS REFERENCE TO RELATED APPLICATION

This application is based upon and claims the benefit of priority from the prior Japanese Patent Application No. 2001-166041, filed on Jun. 1, 2001, the entire contents of which are incorporated by reference.

BACKGROUND OF THE INVENTION

The present invention relates to a semiconductor memory device having floating gates. Particularly, this invention relates to a semiconductor memory device having floating gates formed on a device-isolation region and a method of producing this type of semiconductor memory device.

A device-isolation region with a shallow trench, a shallow-trench isolation (termed STI hereinafter) region, is provided in device isolation process to meet the demands for scaling-down under a specific design rule for miniaturization of highly integrated semiconductor memory devices.

A known method of producing a semiconductor memory device is described with reference to FIGS. 1A to 1G, focusing on forming memory-cell sections.

As shown in FIG. 1A, STI regions 101 are formed in a semiconductor substrate 100, and then gate oxide films 102 are formed on the semiconductor substrate 100. Formed next are floating gates 103, each formed on a part of the corresponding gate oxide film 102 and STI region 101. A CVD silicon oxide film 104 is then formed on a part of each floating gate 103 by chemical vapor deposition (termed CVD hereinafter). Formed on each side wall of the CVD silicon oxide film 104 in the same way is a CVD silicon-oxide-film side wall 105.

Next, as shown in FIG. 1B, reactive ion etching (termed RIE hereinafter) is applied to provide a groove 106 in each STI region 101, having 50 nm in depth from the upper surface of each STI region 101 and makes thin films of the CVD silicon oxide films 104 and CVD silicon-oxide-film side walls 105.

The CVD silicon oxide films 104 and CVD silicon-oxide-film side walls 105 formed on the floating gates 103 are removed by HF paper cleaning, as shown in FIG. 1C.

Next, as shown in FIG. 1D, a gate-to-gate insulating film 107 of an ONO film having 20 nm in entire thickness is deposited over the entire device surface by low-pressure chemical vapor deposition (termed LP-CVD hereinafter). The ONO film is an insulating film having a three-layer structure of a silicon oxide film (O), a silicon nitride film (N) and another silicon oxide film (O), termed an inter-poly insulating film.

Deposited over the entire device surface by LP-CVD, as shown in FIG. 1E, is a P-type-impurity-doped polycrystalline silicon layer 108 having about 100 nm in thickness, followed by a tungsten silicide film 109 having about 50 nm in thickness deposited by sputtering. The polycrystalline silicon layer 108 and the tungsten silicide film 109 function as control gates for this semiconductor memory device. Deposited next on the tungsten silicide film 109 by LP-CVD is a silicon nitride film 110 having thickness in the range from 200 nm to 230 nm, for example.

The silicon nitride film 110 is made thin, as shown in FIG. 1F, by removing the film 110 by a certain thickness.

A structure of such semiconductor memory device and a method of producing such semiconductor memory device are shown for example in FIGS. 17 to 25 in Japanese Patent Application No. 11-350841 (Japanese Unexamined Patent Publication No. 2001-168306).

The known semiconductor memory device described above has the following drawbacks:

Metallic substances, if attached on an exposed surface of the semiconductor memory device during the process in FIG. 1C, could cause crystal defects, low reliability, and so on. The buried surface under the gate-to-gate insulating film 107 should be cleaned for preventing such phenomena to enhance insulating property. This is usually performed with dilute hydrofluoric acid effective for metal removal.

The dilute-hydrofluoric-acid cleaning etches a silicon oxide film equally in all directions. In detail, as shown in FIG. 1G, an enlarged view of a block Q in FIG. 1F, etching has advanced in a lateral direction over the exposed surface of the STI region 101 under the floating gate 103.

The advancement of etching forces the floating gate 103 to face the polycrystalline silicon 108 at two corners R and S via the gate-to-gate insulating film 107. Electric flux lines will converge at the corners R and S of the floating gate 103 toward the polycrystalline silicon layer 108 to increase electric field locally in accordance with the curvature radius of each corner.

Increase in electric field locally converged at the corners R and S of the floating gate 103 and applied to the gate-to-gate insulating film 107 while the memory cell is operating for writing or erasing could cause a low insulating property. This leads to a high probability of memory-cell writing/erasing property lowering or memory-cell threshold-level variation.

Dielectric breakdown or increased leak current could also be caused under stresses due to electric field applied and converged on the gate-to-gate insulating film 107 in memory-cell writing, erasing or charging.

SUMMARY OF THE INVENTION

A semiconductor memory device having at least one floating gate according to the first aspect of the present invention includes: a semiconductor substrate; at least one device-isolation region buried in the semiconductor substrate, having a top surface protruding from a top surface of the semiconductor substrate, the top surface of the device-isolation region having a concave section that has a depression thereon; at least one gate-insulating film formed on the semiconductor substrate; a first gate formed on the gate-insulating film, the device-isolation region and the depression; a gate-to-gate insulating film formed on the first gate and in the concave section and the depression of the device-isolation region; and a second gate formed on the gate-to-gate insulation film, the depression being filled with the second gate.

Moreover, a semiconductor memory device having floating gates according to the second aspect of the present invention includes: a semiconductor substrate; at least one device-isolation region buried in the semiconductor substrate, having a top surface protruding from a top surface of the semiconductor substrate, the top surface of the device-isolation having a concave section that has a depression thereon; at least one gate-insulating film formed on the semiconductor substrate; a plurality of first gates formed on the gate-insulating film, the device-isolation region and the depression, the first gates being isolated from each other on the device-isolation region; a gate-to-gate insulating film formed on the first gates and in the concave section and the depression of the device-isolation region, the first gates being isolated from each other by the gate-to-gate insulating film; and a second gate formed on the gate-to-gate insulation film, the depression area being filled with the second gate.

Furthermore, a method of producing a semiconductor memory device having floating gates according to the third aspect of the present invention forms at least one device-isolation region and a gate-insulating film on a semiconductor substrate; forms a first gate material on the device-isolation region and the gate-insulating film; forms first gate electrodes by separating the first gate material into two gate materials, the separated materials being left on the device-isolation region; provides a concave section on the device-isolation region, the concave section being narrower than a distance between the separated first gate electrodes; provides a depression in the device-isolation region under the first gate electrodes and at edges of the concave section on the device-isolation region; forms a gate-to-gate insulating film on the concave section on the device-isolation region and the first gate electrodes, the depression in the device-isolation region being filled with the gate-to-gate insulating film; and forms a second gate electrode on the gate-to-gate insulation film.

Moreover, a method of producing a semiconductor memory device having floating gates according to the fourth aspect of the present invention forms a gate-insulating film and then a first gate material on a semiconductor substrate; provides at least one groove through the first gate material, the gate-insulating film and a part of the semiconductor substrate; fills the groove with an insulating material to form a device-isolation region having a top surface higher than a top surface of the first gate material; forms a second gate material on the first gate material and the device-isolation region; forms second gate electrodes by separating the second gate material into two gate materials, the separated materials being left on the device-isolation region; provides a concave section on the device-isolation region, the concave section being narrower than a distance between the separated second gate electrodes; provides a depression in the device-isolation region under the second gate electrodes and at edges of the concave section on the device-isolation region; forms a gate-to-gate insulating film on the concave section on the device-isolation region and the second gate electrodes, the depression in the device-isolation region being filled with the gate-to-gate insulating film; and forms a third gate electrode on the gate-to-gate insulating film.

DETAILED DESCRIPTION OF THE EMBODIMENTS

Several embodiments of semiconductor memory device having floating gates and method of producing the semiconductor memory device according to the present invention will be disclosed with reference to the attached drawings. There is disclosed below focus on memory cells of a non-volatile semiconductor memory device as a representative of application of the present invention.

First Embodiment

Figure 1A:
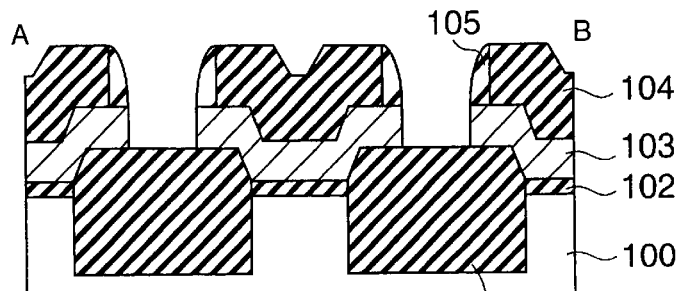
FIGS. 1A to 1F are sectional views each illustrating a process of a method of producing a known semiconductor memory device, FIG. 1G being an enlarged sectional view of a block Q in FIG. 1F.
Figure 1B:
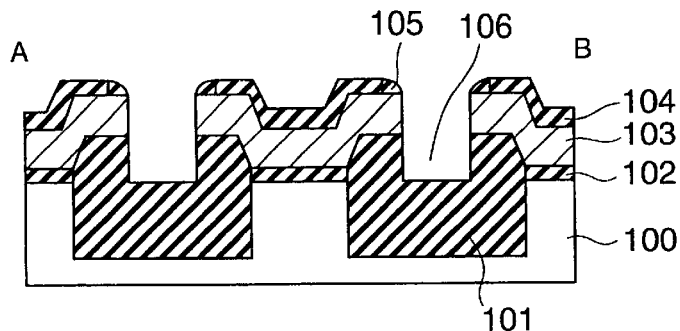
Figure 1C:
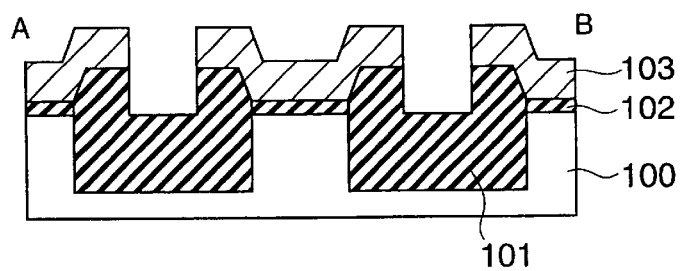
Figure 1D:
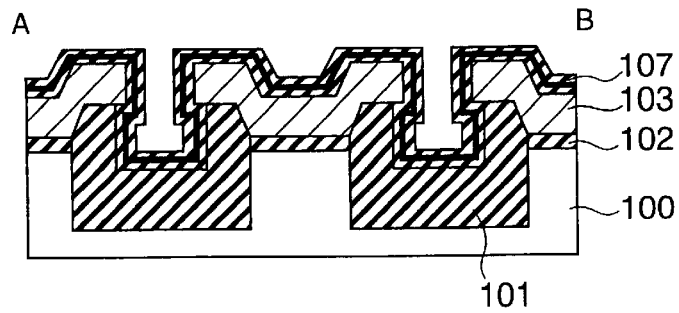
Figure 1E:
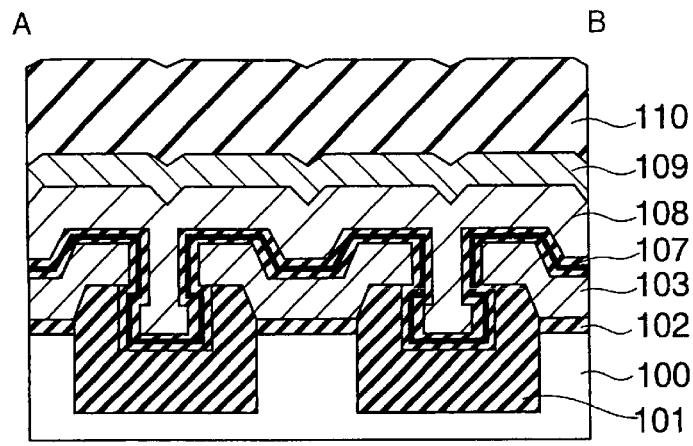
Figure 1F:
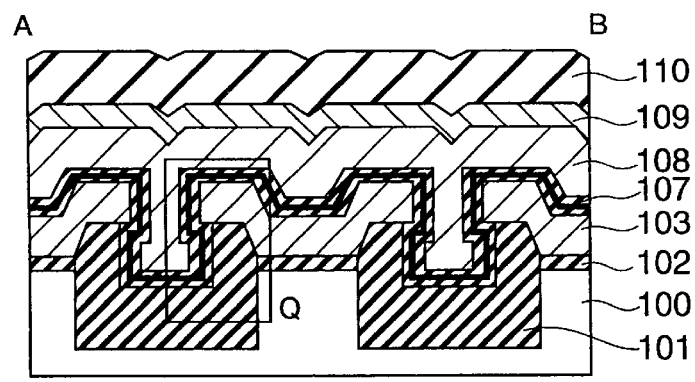
Figure 1G:
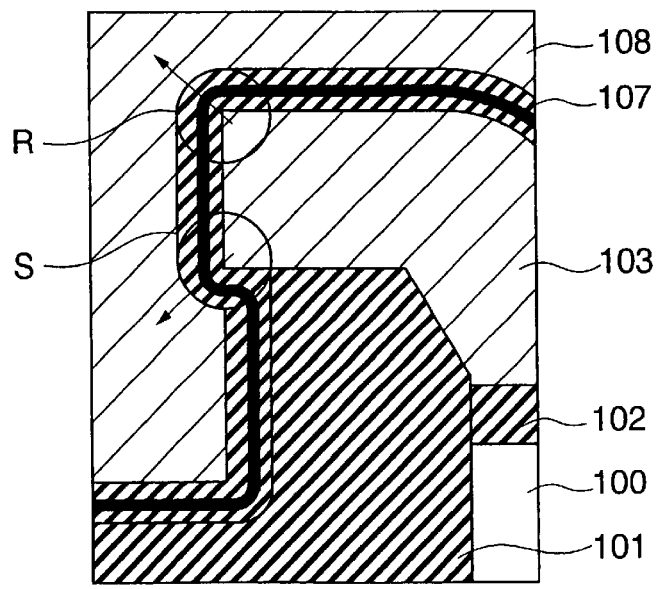
Figure 2:
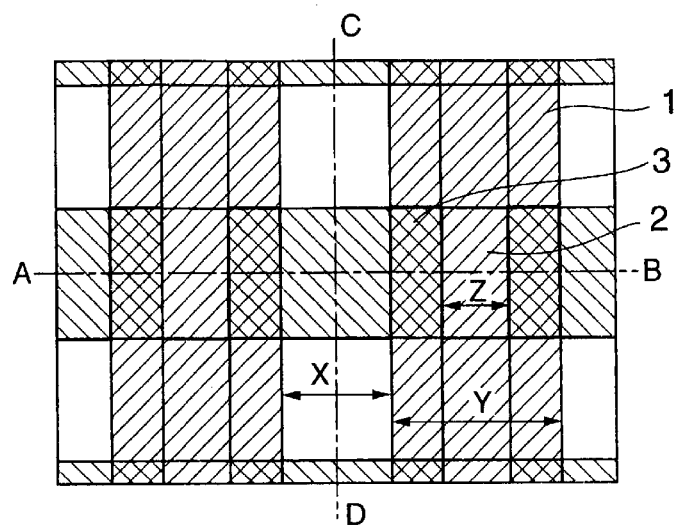
FIG. 2 is a plan view illustrating memory cells in semiconductor memory device of a first and a second embodiment according to the present invention.

The planer structure of memory cells is shown in FIG. 2. Several device-isolation regions 1 are formed in stripe at a constant interval in the vertical direction. Several control gates 2 are also formed in stripe at a constant interval in the horizontal direction orthogonal to the device-isolation regions 1. The regions with no device-isolation regions 1 formed are device regions.

Formed under a part of each control gate 2 at a constant interval are several floating gates 3. The length of each floating gate 3 in the vertical direction in FIG. 2 is equal to that of each control gate 2. The length of the floating gate 3 in the horizontal direction in FIG. 2 is, however, shorter than the control gate 2. A device width X between adjacent device-isolation regions 1 is, for example, in the range from about 100 to 150 nm. Another device width Y for the device-isolation regions 1 is, for example, in the range from about 200 to 250 nm. A length Z between adjacent floating gates 3 in the horizontal direction in FIG. 2 is, for example, in the range from about 70 to 100 nm.

Figure 3A:
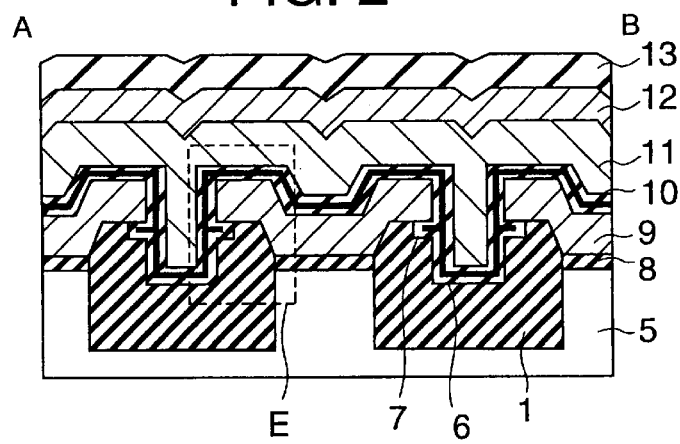
FIG. 3A is a sectional view taken on line "A-B" of FIG. 2, illustrating the memory cells in the semiconductor memory device of the first embodiment according to the present invention, FIG. 3B being an enlarged sectional view of a block E in FIG. 3A.

Shown in FIG. 3A is a sectional view taken on line "A-B" of FIG. 2. The device-isolation regions 1 are formed in a semiconductor substrate 5. The depth of each device-isolation region 1 buried in the semiconductor substrate 5 is, for example, in the range from about 200 to 250 nm. The device-isolation regions 1 are made of a HDP (High Density Plasma)-CVD oxide film. Each device-isolation region 1 has a protruding section higher than the top surface of the semiconductor substrate 5. The protruding section has a concave section 6 on the center. Moreover, the concave section 6 has a depression 7 at the upper edges.

Gate oxide films (tunnel oxide films) 8, gate-insulating films of, for example, oxynitride are formed on the semiconductor substrate 5, in the range from about 5 to 10 nm in thickness.

Each of several floating gates 9 is formed on a gate oxide film 8 and a part of the protruding section of the device-isolation region 1, in the range from about 150 to 200 nm in thickness. The floating gates 9 are isolated from each other on the device-isolation regions 1. The floating gates 9 are formed on the gate-insulating films 8 and device-isolation regions 1, with almost the same thickness, thus the top surface of each floating gate 9 is irregular depending on the height of the bottom surface thereof.

A gate-to-gate insulating film 10 is formed on each floating gate 9 and in the concave section 6 and depression 7. The gate-to-gate insulating film 10 is made, for example, of an ONO film with thickness of, for example, about 5 nm for a silicon oxide film, about 7 nm for a silicon nitride film formed thereon and about 5 nm for another silicon oxide film formed thereon. Every depression 7 formed between the lower edge of each floating gate 9 and the upper edge of the protruding section of each device-isolation region 1 is filled with the gate-to-gate insulating film 10. The top surface of the gate-to-gate insulating film 10 is irregular depending on the height of the bottom surface thereof.

Formed on the gate-to-gate insulating film 10 is a polycrystalline silicon layer 11 with which the concave section 6 of each device-isolation region 1 is filled. The top surface of the polycrystalline silicon layer 11 is irregular depending on the height of the bottom surface thereof.

The thickness of the polycrystalline silicon layer 11 formed on the gate-to-gate insulating film 10 but not filled in the concave section 6 is, for example, in the range from about 70 to 100 nm.

A tungsten silicide layer 12 is then formed on the polycrystalline silicon layer 11, having the thickness, for example, in the range from about 40 to 60 nm. The top surface of the tungsten silicide layer 12 is irregular depending on the height of the bottom surface thereof. The polysilicon layer 11 and the tungsten silicide layer 12 function as the control gates 2. A silicon nitride film 13 is formed on the tungsten silicide layer 12, having the thickness of about 100 nm, for example.

For example, the width of the protruding section 6 in each device-isolation region is about 100 nm, the thickness of the gate-to-gate insulating film 10 is about 20 nm and the width of the polysilicon layer 11 filled in the protruding section 6 is about 60 nm.

Figure 3B:
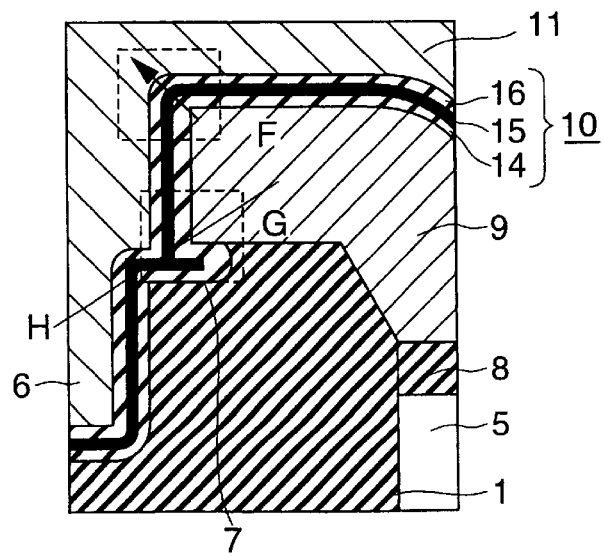

The enlarged sectional view of a block E indicated by a dot line in FIG. 3A is shown in FIG. 3B. Illustrated in this figure with an arrow is electric filed generated in a block F indicated by a dot line at an upper edge of each floating gate 9. On the contrary, no electric filed is generated in a block G indicated by a dot line at a lower edge of each floating gate 9. This is because the floating gate 9 has been covered with the thick gate-to-gate insulating film 10 at the corner of the lower edge. In detail, the gate-to-gate insulating film 10 has been formed of the lower silicon oxide film 14, a silicon nitride film 15 formed thereon and the upper silicon oxide film 16 formed thereon. Firstly, the silicon oxide film 14 has been filled in the exposed depression 7 followed by the silicon nitride film 15 on the silicon oxide film 14, as if the nitride film being folded.

No electric filed will be generated in the direction indicated by a straight line H, or the center line on the lower corner of each floating gate 9. This is because the gate-to-gate insulating film 10 exists twice from the lower corner of the floating gate 9 toward the polycrystalline silicon layer 11 along the straight line H. The gate-to-gate insulating film 10 lies as inclined to the depression 7 in the direction of the straight line H. The thickness of the gate-to-gate insulating film 10 at lower corner of the floating gate 9 in the direction of the straight line H is thus thicker than that formed on the other regions. This serves to generate no electric fields.

Figure 4:
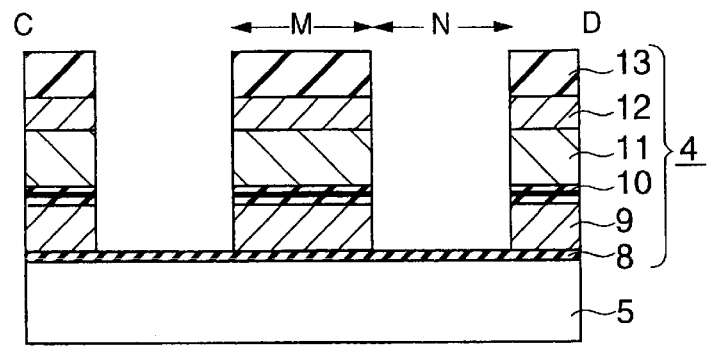
FIG. 4 is a sectional view taken on line "C-D" of FIG. 2, illustrating the memory cells in the semiconductor memory device of the first embodiment according to the present invention.

Shown in FIG. 4 is a sectional view taken on line "C-D" of FIG. 2. The gate-insulating film 8 has been formed over the semiconductor substrate 5. Formed on gate-forming regions on the gate-insulating film 8 are multi-layered gate electrodes 4, each made of the floating gate 9, the gate-to-gate insulating film 10, the polycrystalline silicon layer 11, the tungsten silicide layer 12 and the silicon nitride film 13. Although not shown, source/drain impurity regions for each transistor have been formed near the surface of the semiconductor substrate 5 between adjacent multi-layered gate electrodes 4.

A gate width M for each multi-layered gate electrode 4 is, for example, in the range from about 150 to 170 nm. A space N between adjacent multi-layered gate electrodes 4 is also, for example, in the range from about 150 to 170 nm.

The first embodiment of semiconductor memory device has the gate-to-gate insulating film formed as if folded in the depression at the lower corner G etched further under each floating gate, thus not suffering convergence of electric field at the corner G. The first embodiment therefore achieves decrease in convergence of electric field to the gate-to-gate insulating film almost half of the known device, to restrict lowering of reliability which could otherwise occur such as low memory-cell writing and erasing property, variation in memory-cell threshold levels and low charge conservation.

In detail, this device configuration restricts convergence of electric field to the gate-to-gate insulating film at the floating-gate corners, to relieve voltage breakdown and leak current which could otherwise occur to the gate-to-gate insulating film due to convergence of electric field, for enhanced reliability of the semiconductor memory device. This is because convergence of electric field is restricted at the lower edge of each floating gate in the first embodiment, whereas which occurs to both upper and lower edges of each floating gate of the known device. Moreover, the first embodiment enhances reliability of the semiconductor memory device by preventing each floating gate from being not capable of charging electrons which could otherwise occur due to voltage breakdown or high leak current to the gate-to-gate insulating film under stresses due to frequent writing/erasing operations.

Disclosed next is a method of producing the semiconductor memory device of the first embodiment according to the present invention. The disclosure starts with FIGS. 15 to 28 for the semiconductor memory device in section taken on line "A-B" of FIG. 2.

Figure 5:
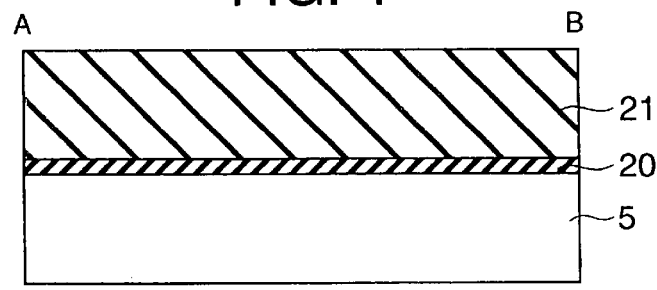
FIGS. 5 to 24 are sectional views, taken on line "A-B" of FIG. 2 illustrating the memory cells, each illustrating a process of a method of producing the semiconductor memory device of the first embodiment according to the present invention.

As shown in FIG. 5, a silicon thermal oxide film 20 of about 20 nm in thickness for example, is formed by dry oxidation on the semiconductor substrate 5, for example, a silicon substrate. A silicon nitride film 21 of about 300 nm in thickness for example, is deposited by LP-CVD on the silicon thermal oxide film 20. The silicon nitride film 21 will function as a masking material for forming trenches on the semiconductor substrate 5 and also as a CMP stopper.

Figure 6:
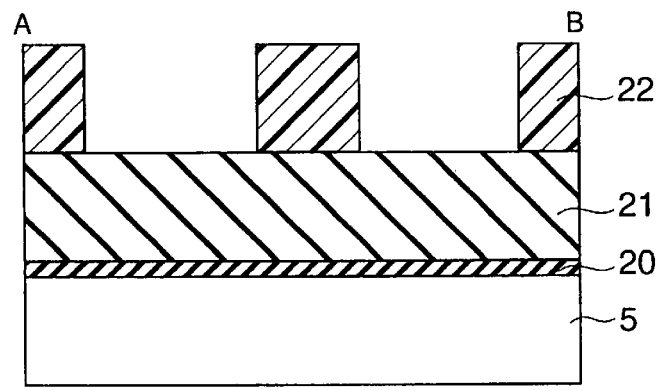

Next, as shown in FIG. 6, the entire device surface is covered with a photoresist 22 of about 600 nm in thickness for example. The photoresist 22 is then processed, by lithography, into a specific device-isolation pattern.

Figure 7:
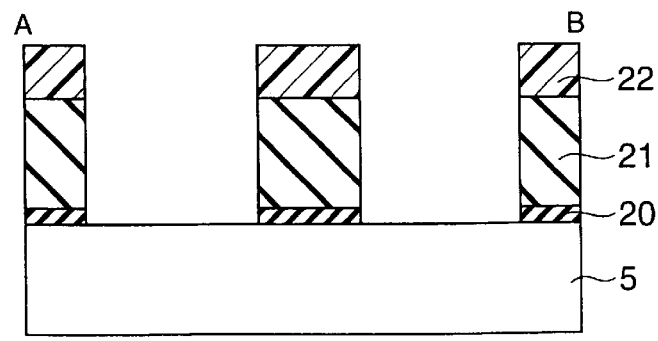
Figure 8:
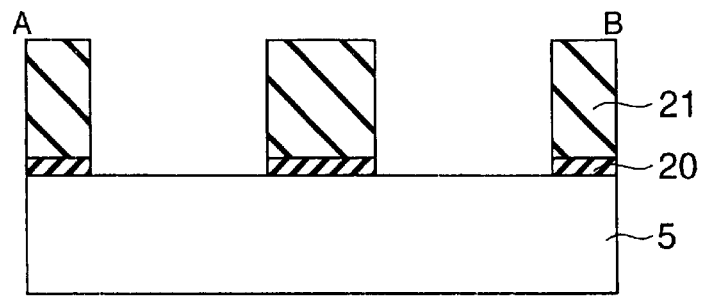
Figure 9:
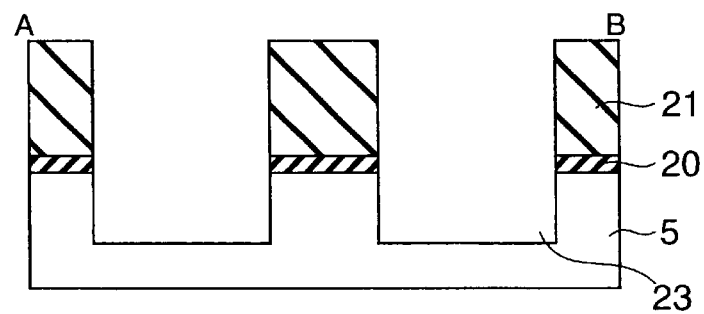

The silicon nitride film 21 and the silicon thermal oxide film 20 are processed as shown in FIG. 7 by RIE with the photoresist 22 as a mask. The photoresist 22 is then removed by ashing, as shown in FIG. 8. The semiconductor substrate 5 is processed as shown in FIG. 9 by RIE with the silicon nitride film 21 as a mask, to provide grooves 23 of about 250 nm in depth for example, as device-isolation regions. The depth of each groove 23 is defined as the length from the top surface of the semiconductor substrate 5 to the bottom of the groove 23.

Figure 10:
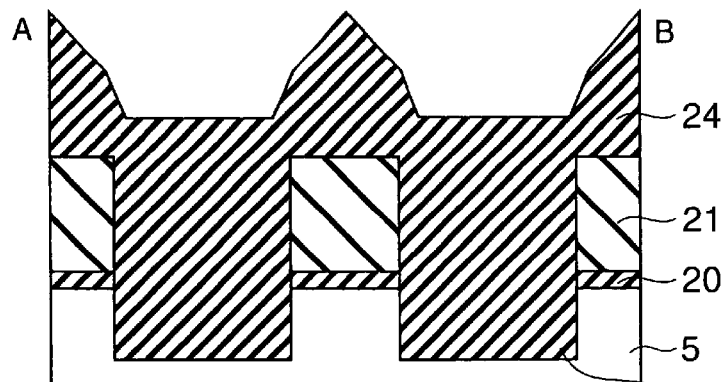

Next, as shown in FIG. 10, the grooves 23 are filled with a CVD silicon oxide film 24 deposited over the entire device surface at about 700 nm in thickness for example, followed by STI to form the device-isolation regions.

Figure 11:
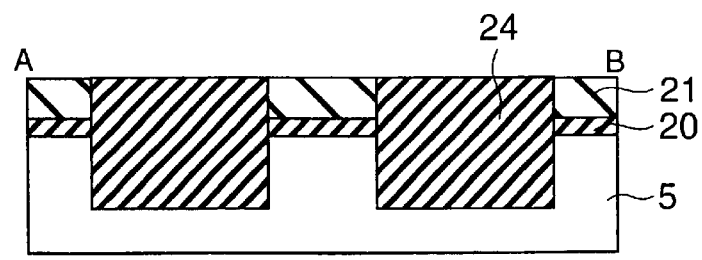

The CVD silicon oxide film 24 is polished into flat by CMP, as shown in FIG. 11. In detail, CMP is performed with the silicon nitride film 21 as a stopper, followed by thermal processing in nitrogen ambient to provide dense CVD silicon oxide films 24. The CPM procedure leaves the silicon nitride film 21 of about 100 nm in thickness for example. The thermal processing is performed in nitrogen ambient, for example, for about one hour at about 900° C. How each CVD silicon oxide film 24 becomes dense is expressed in wet-etch selectivity as follows: The CVD silicon oxide film 24 is dense about 1.3 times the silicon thermal oxide film 20, just after formed. The thermally-processed CVD silicon oxide film 24 will, however, be dense about 1.2 times the silicon thermal oxide film 20.

Figure 12:
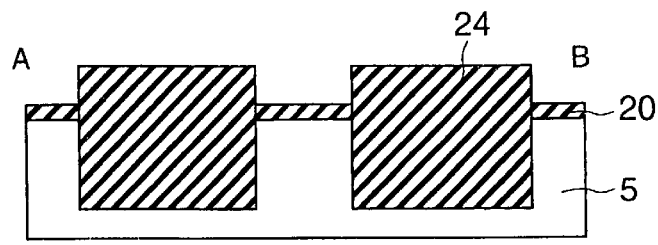
Figure 13:
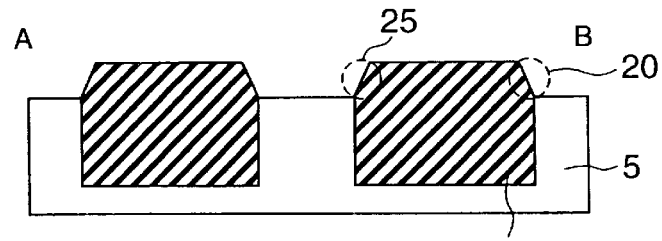

The silicon nitride film 21 is removed as shown in FIG. 12 and further the silicon thermal oxide film 20 is removed as shown in FIG. 13, by wet etching. The wet etching for both films is isotropic etching so that the CVD silicon oxide films 24 will have round corners at upper edges 25. In detail, etching is usually performed for thickness about 1.5 times the silicon thermal oxide film 20 so that each CVD silicon oxide film 24 will be removed by about 40 nm at its surface and corners.

Figure 14:
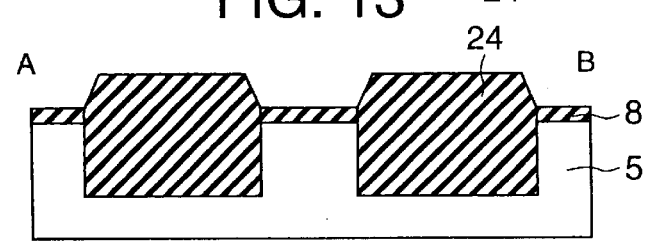

Next, as shown in FIG. 14, a silicon thermal oxide film 8 is formed over the entire device surface at about 10 nm thickness by dry oxidation. The silicon thermal oxide film 8 will function as a tunnel oxide film for memory cells.

Figure 15:
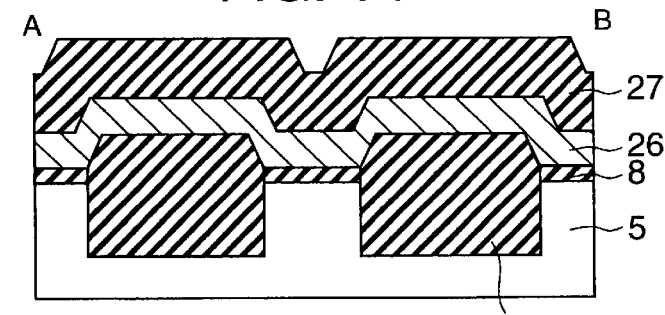

A polycrystalline silicon layer 26 doped with phosphorous as impurities is deposited, by LP-CVD, over the entire device surface at about 100 nm for example, as shown in FIG. 15. The polycrystalline silicon layer 26 will be processed into floating gates in later process stage. Deposited further by LP-CVD over the entire device surface is a CVD silicon oxide film 27 of about 200 nm in thickness for example. The CVD silicon oxide film 27 will be used as a masking material for processing the polycrystalline silicon layer 26.

Figure 16:
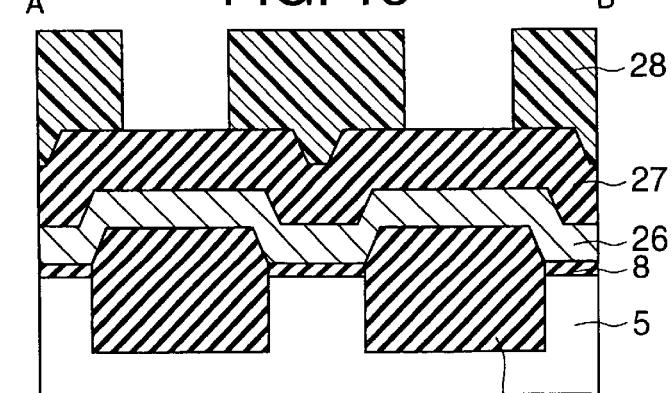

Next, as shown in FIG. 16, the entire device surface is covered with a photoresist 28 of about 600 nm in thickness for example. The photoresist 28 is then processed, by lithography, into a specific floating-gate pattern.

Figure 17:
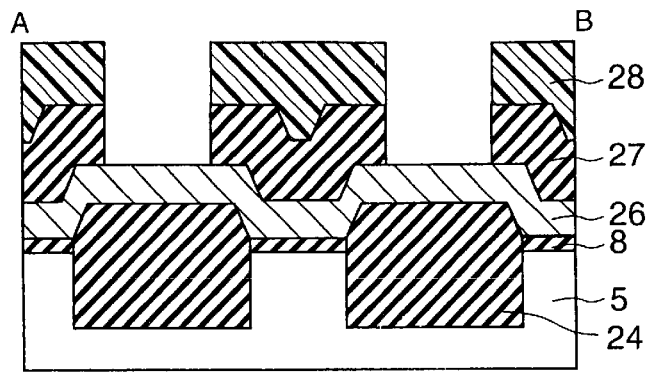
Figure 18:
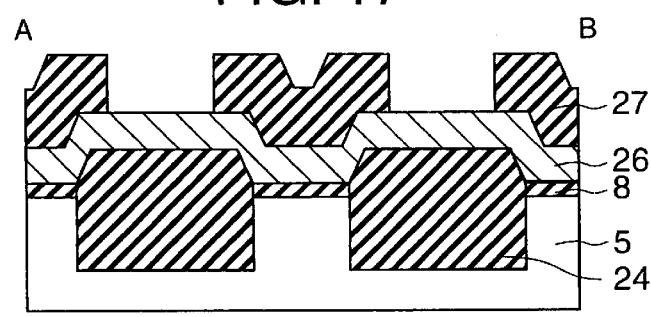
Figure 19:
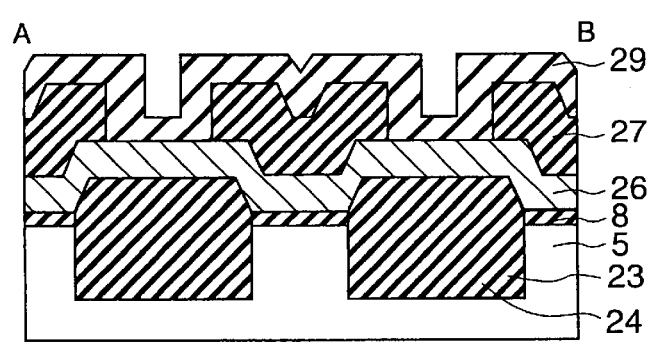

The CVD silicon oxide film 27 is processed as shown in FIG. 17 by RIE with the photoresist 28 as a mask and the polycrystalline silicon layer 26 as a stopper. The photoresist 28 is removed by ashing as shown in FIG. 18. A CVD silicon oxide film 29 is then deposited by LP-CVD over the entire device surface at about 50 nm in thickness for example, as shown in FIG. 19.

Figure 20:
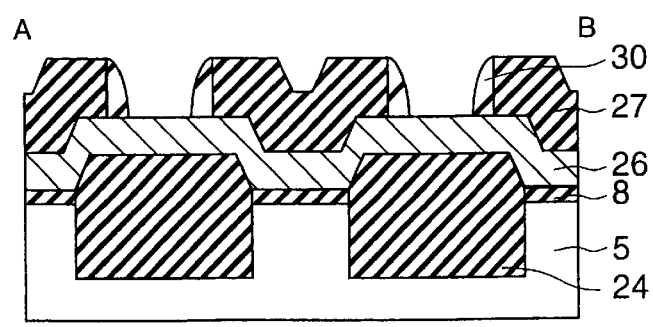
Figure 21:
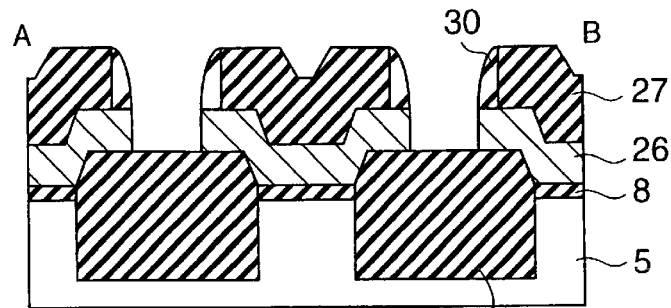

Next, as shown in FIG. 20, the CVD silicon oxide film 29 is processed by RIE with the polycrystalline silicon layer 26 as a stopper to form a CVD silicon-oxide-film side wall 30 at each side face of the CVD silicon oxide film 27 so that the polycrystalline silicon layer 26 will be exposed. The width of the CVD silicon-oxide-film sidewall 30 is about 30 nm, for example, at each side face of the CVD silicon oxide film 27.

The polycrystalline silicon layer 26 is processed by RIE with the CVD silicon oxide films 24 as a stopper. In detail, RIE is performed at a relatively high etch selectivity in relation to the silicon oxide films so that almost no lateral etching will advance with almost no variation in width for the CVD silicon-oxide-film side walls 30. The space between adjacent floating gates is for example about 100 nm.

Figure 22:
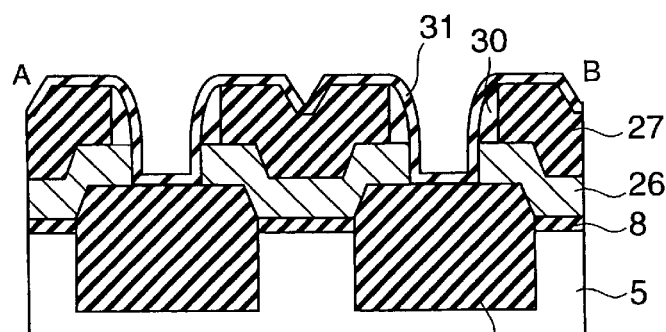
Figure 23:
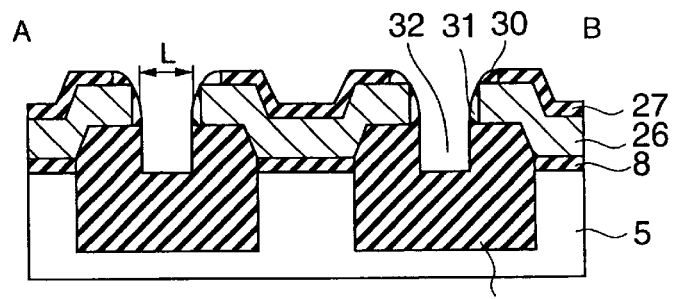

Next, as shown in FIG. 22, a CVD silicon oxide film 31 is deposited over the entire device surface at about 20 nm for example. The CVD silicon oxide films 31, 24 and 27, and also the CVD silicon-oxide-film side walls 30 are processed to provide a groove 32 in each CVD silicon oxide film 24. The width of each groove 32 is about 100 nm for example. The thickness of each CVD silicon oxide film 31 left on the CVD silicon oxide film 24 and above each groove 32 is about 3 nm for example. This thickness corresponds to the gap between an edge of each groove 32 and an edge of the corresponding polycrystalline silicon layer 26.

Figure 24:
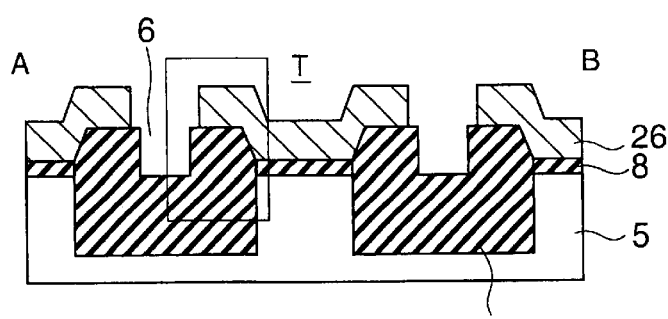

The CVD silicon oxide films 27 and 31, and also the CVD silicon-oxide-film side walls 30 are selectively removed by HF paper cleaning to provide a concave section 6 above each CVD silicon oxide film 24, as shown in FIG. 24. This process is performed for later stages to electrically shield adjacent memory cells to relieve parasitic capacitance to be generated therebetween for less variation in cell-writing threshold levels, with the polysilicon layer, which will become control gates in later stage, filled in the STI grooves 32. In detail, the groove provided in each CVD silicon oxide film 24 will extend the passage for static capacitance passing through the film 24, for less parasitic capacitance to be generated between adjacent floating gates.

Variation in cell-writing threshold level depends on the behavior of charges in floating gates of adjacent memory cells, which varies due to parasitic capacitance generated between adjacent cells during a reading operation.

HF paper cleaning allows selective etching to silicon oxide films depending on moisture density therein. In this embodiment, the CVD silicon oxide films 27 and 31, and also the CVD silicon-oxide-film side walls 30, the films with no thermal processing applied, are only selectively removed whereas the thermally processed CVD silicon oxide films 24 with a low moisture density remain, by HF paper cleaning. The width of each groove is about 100 nm.

Figure 25:
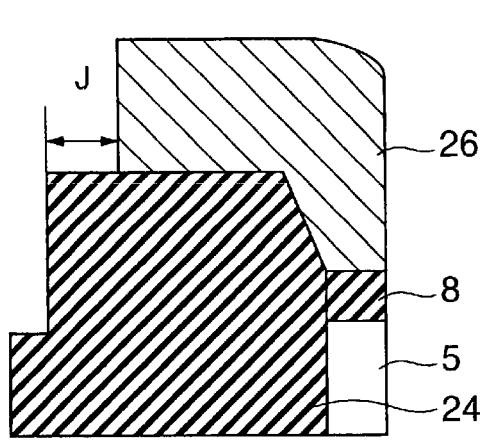
FIG. 25 is an enlarged sectional view of a block I in FIG. 24.

Shown in FIG. 25 is an enlarged sectional view of a block I indicated by a solid line for the peripherals of an edge of each of polycrystalline silicon layer 26 in FIG. 24. FIG. 25 shows a distance J between each groove 32 and the corresponding polycrystalline silicon layer 26 due to pre-existence of the CVD silicon oxide film 31. The distance J is obtained at a rate higher than an etching rate K for the CVD silicon oxide film 24 in a hydrofluoric-acid applying process.

Figure 26:
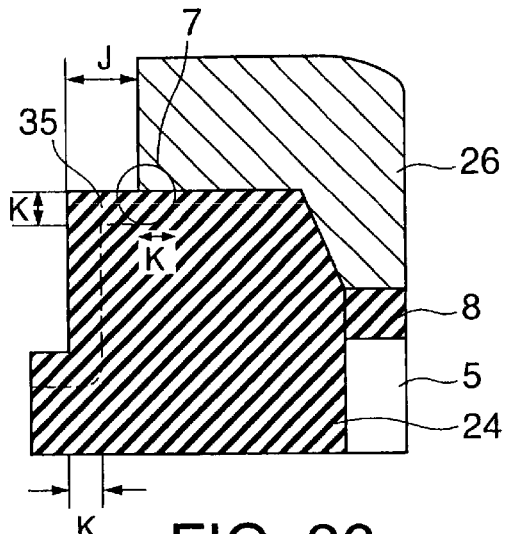
FIG. 26 is an enlarged sectional view of an etched region of the block I in FIG. 24.

The distance J allows a dilute hydrofluoric-acid applying process to be performed before deposition of the gate-to-gate insulating films, as shown in FIG. 26. This process restricts isotropic etching by the etching rate K within a block 35 indicated by a dot line. The block 35 is removed by the dilute hydrofluoric-acid applying process to provide the depression 7 due to etching advanced on the upper edge of the CVD silicon oxide film 24 in the lateral direction.

Metallic substances, if attached on an exposed part of the semiconductor memory device could cause crystal defects, low reliability, and so on. The buried surface is cleaned for preventing such phenomena by the hydrofluoric-acid applying process effective for metal removal, to enhance insulating property for the gate-to-gate insulating film 10. The hydrofluoric-acid applying process is performed with oxide-film etching by thickness in the range from about 1 to 2 nm. The hydrofluoric-acid applying process promotes etching on the exposed surface of the CVD silicon oxide film 24 and also a region of the polycrystalline layer 26, which faces the groove.

Figure 27:
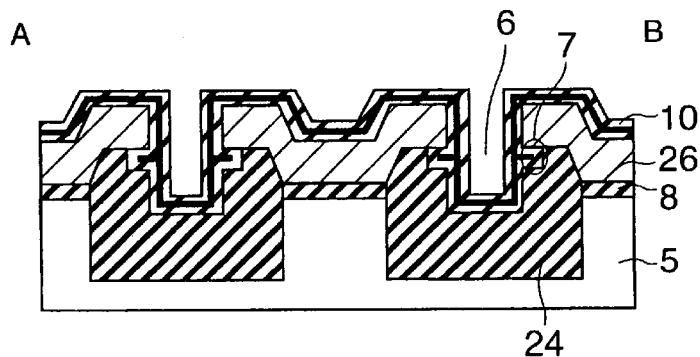
FIGS. 27 and 28 are sectional views, taken on line "A-B" of FIG. 2 illustrating the memory cells, each illustrating a process of a method of producing the semiconductor memory device of the first embodiment according to the present invention.

Next, as shown in FIG. 27, an ONO film is deposited by LP-CVD in each depression 7, as if being folded, as the gate-to-gate insulating film 10 of about 20 nm in total thickness.

The distance J for the floating gate to provide the depression 7 is set, before ONO-film deposition, at a rate higher than the etching rate for the hydrofluoric-acid applying process. The ONO film is then filled in between the floating gate and the top surface of device-isolation region.

Figure 28:
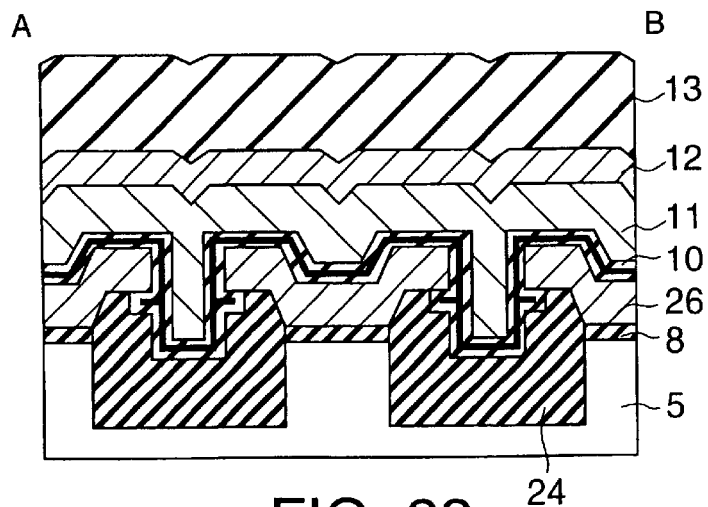

Next, as shown in FIG. 28, the polycrystalline silicon layer 11 with phosphorous as impurities is deposited by LP-CVD over the entire device surface at about 100 nm in thickness for example. The tungsten silicide layer 12 having about 50 nm, for example, in thickness is then formed by sputtering on the polycrystalline silicon layer 11, followed by the silicon nitride film 13 deposited thereon by LP-CVD, at about 200 nm in thickness.

The polycrystalline silicon layer 11 may be formed in the range from about 5 to 500 nm for example. Polycide or metal may be used instead of the polycrystalline silicon layer 11. The polycide may be WSi, NiSi, MOSi, TiSi or CoSi, for example. Mono-crystal silicon with no impurities doped may be used at first, which is then doped with phosphorous, arsenic or boron by ion implantation with thermal treatment in later stages to be changed into the polycrystalline silicon layer 11.

One of the purposes of the processes illustrated in FIGS. 18 to 20 is to obtain an enough alignment margin for the patterns of device-isolation regions and device regions in FIG. 6 and the patterns of floating gates in FIG. 16. Another purpose is to gain a large floating-gate surface area, or a high memory-cell coupling ratio to achieve efficient voltage transfer to the gate oxide films which will function as a tunnel oxide film.

Figure 29:
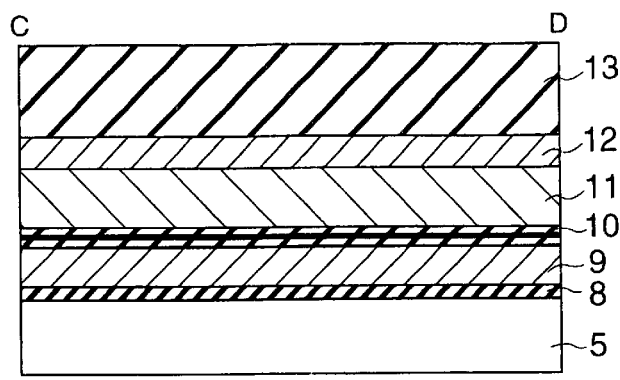
FIGS. 29 to 32 are sectional views, taken on line "C-D" of FIG. 2 illustrating the memory cells, each illustrating a process of a method of producing the semiconductor memory device of the first embodiment according to the present invention.

Disclosed next is a method of producing the semiconductor memory device with respect to FIG. 4 and also FIGS. 29 to 32, the sectional views taken on line "C-D" of FIG. 2. FIG. 29 shows a sectional view taken on line "C-D" of FIG. 2, in the process illustrated in FIG. 28, the sectional view taken on line "A-B" of FIG. 2.

Illustrated in FIG. 29 are the gate oxide film 8, the floating gate 9, the gate-to-gate insulating film 10, the polycrystalline silicon layer 11, the tungsten silicide layer 12 and the silicon nitride film 13, laminated in order on the semiconductor substrate 5.

Figure 30:
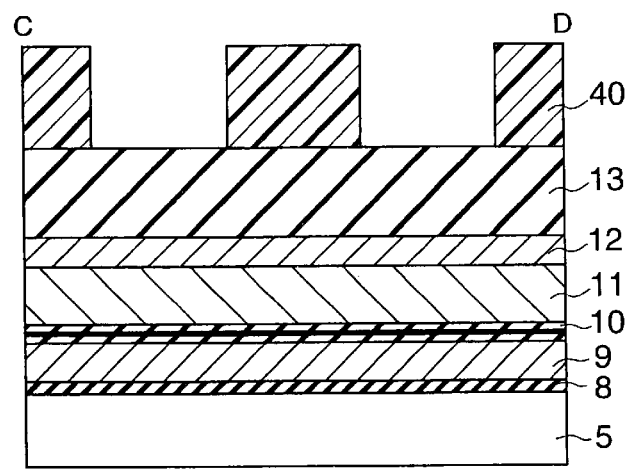
Figure 31:
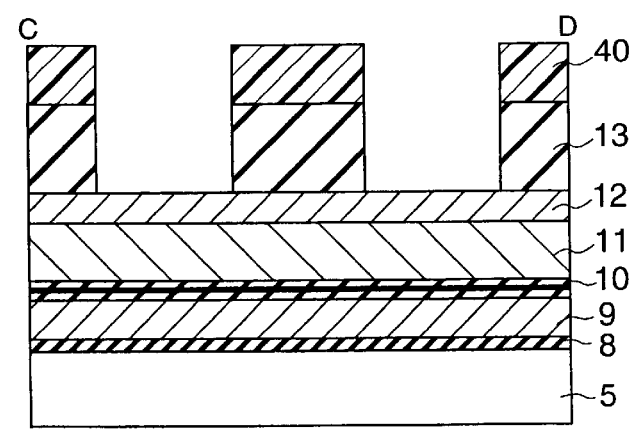
Figure 32:
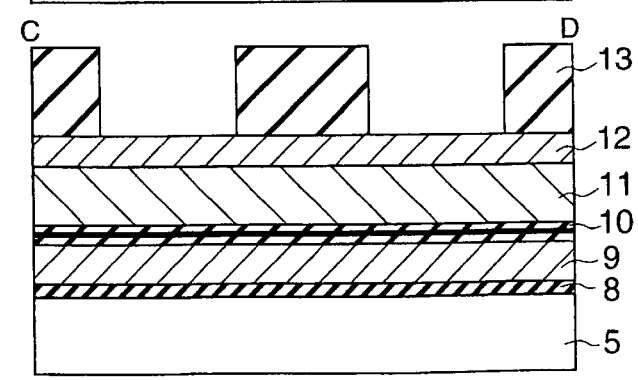

As shown in FIG. 30, a photoresist 40 is applied over the entire device surface at about 600 nm thickness for example, and then processed into a specific gate pattern by lithography. The silicon nitride film 13 is processed by RIE with the photoresist 40 as a mask to expose the tungsten silicide layer 12 to the openings, as shown in FIG. 31. The photoresist 40 is then removed by ashing to expose each silicon nitride film 13, as shown in FIG. 32.

The tungsten silicide layer 12, the polycrystalline silicon layer 11, the gate-to-gate insulating film 10 and the floating gate 9 are processed by RIE with the silicon nitride films 13 as a mask to form a specific gate structure.

The floating gate 9 is etched at a high selectivity to the gate oxide film 8 to leave the film 8 on the semiconductor substrate 5. Oxidation is then performed for device recovery from damages due to attacks of plasma and ion injected into the semiconductor substrate and gate oxide film edges and also crystallization of the tungsten silicide layer 12 for lowering resistance.

Although not shown for the subsequent process stages, a diffusion layer is formed and then a inter-layer film is deposited over the entire device surface, followed by contact and wiring formation, to produce a MISFET.

The method of producing the semiconductor memory device according to the first embodiment allows further advancement of etching, before formation of the gate-to-gate insulating film, on the exposed STI grooves after formation of the floating gate over the device-isolation regions formed by STI.

This configuration restricts electric-field convergence to the gate-to-gate insulating film at the floating-gate corners and also prevents low withstand voltages and increased leak currents which may otherwise occur due to electric-field convergence, thus achieving high yielding and reliability for semiconductor memory devices.

Moreover, this production method protects the semiconductor memory devices against voltage brake down or high leak current to the gate-to-gate insulating film, that could cause less floating-gate chargeability, during writing/erasing operations to be performed several times just after production, thus achieving high yielding.

This production method further protects semiconductor memory devices against voltage brake down or high leak current to the gate-to-gate insulating film, which could cause less floating-gate chargeability, due to stresses after writing/erasing operations performed many times, thus achieving high yielding.

Second Embodiment

Figure 33:
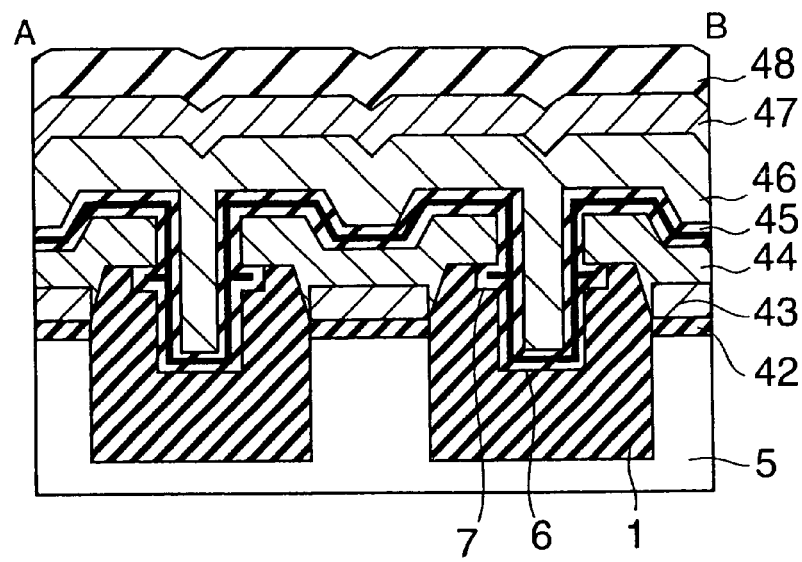
FIG. 33 is a sectional view taken on line "A-B" of FIG. 2, illustrating the memory cells in the semiconductor memory device of the second embodiment according to the present invention.
Figure 34:
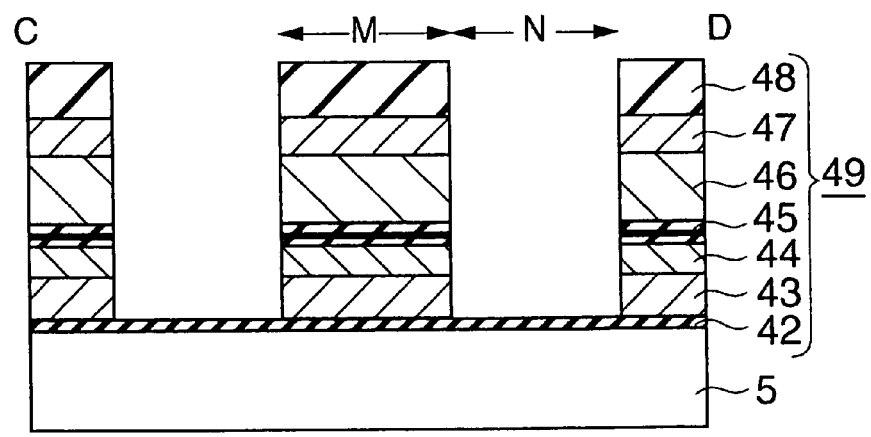
FIG. 34 is a sectional view taken on line "C-D" of FIG. 2, illustrating the memory cells in the semiconductor memory device of the second embodiment according to the present invention.

Disclosed with respect to FIGS. 33 and 34 is the configuration of semiconductor memory device in this embodiment. The planer structure of this semiconductor memory device is also shown in FIG. 2, like the first embodiment. FIG. 33 is a sectional view taken on line "A-B" of FIG. 2.

Formed in the semiconductor substrate are several device-isolation regions 1. The depth of each device-isolation region 1 buried in the semiconductor substrate 5 is for example in the range from about 200 to 250 nm. Each device-isolation region 1 is made of a HDP-CVD oxide film. Each device-isolation region 1 has a protruding section higher than the top surface of the semiconductor substrate 5.

The protruding section has a concave section 6 on the center. Moreover, the concave section 6 has a depression 7 at the upper edges.

Gate oxide films (tunnel oxide films) 42 of, for example, oxynitride are formed on the semiconductor substrate 5 in the range from about 5 to 10 nm.

A floating gate formed on each gate oxide film 42 and a part of each protruding section of the device-isolation region 1 is made of a first polycrystalline silicon layer 43 and a second polycrystalline silicon layer 44 formed thereon, having thickness in the range from about 150 to 200 nm for example. There are several floating gates, made of the first and second polycrystalline silicon layers 43 and 44, adjacent floating-gate regions being isolated from each other on each device-isolation regions 1.

Each first polycrystalline silicon layer 43 is formed on the gate oxide film 42. Each second polycrystalline silicon layer 44 is formed on the corresponding first polycrystalline silicon layer 43 and device-isolation region 1. The second polycrystalline silicon layer 44 has almost the same thickness, thus the top surface thereof being irregular depending on the height of the bottom surface thereof.

A gate-to-gate insulating film 45 is formed on the second polycrystalline silicon layers 44 and in the concave sections 6 and the depression 7. The gate-to-gate insulating film 45 is made, for example, of an ONO film with thickness of, for example, about 5 nm for a silicon oxide film, about 7 nm for a silicon nitride film formed thereon and about 5 nm for another silicon oxide film formed thereon.

All of the depressions 7 each formed between the lower edge of the second polycrystalline silicon layer 44 and the upper edge of the protruding section of the device-isolation region 1 are filled with the gate-to-gate insulating film 45. The top surface of the gate-to-gate insulating film 45 is irregular depending on the height of the bottom surface thereof.

Formed on the gate-to-gate insulating film 45 is a polycrystalline silicon layer 46 with which the concave sections 6 of the device-isolation regions 1 are filled. The top surface of the polycrystalline silicon layer 46 is irregular depending on the height of the bottom surface thereof. The thickness of the polycrystalline silicon layer 46 formed on the gate-to-gate insulating film 45 but not filled in the concave sections 6 is, for example, in the range from about 70 to 100 nm.

A tungsten silicide layer 47 is then formed on the polycrystalline silicon layer 46, having the thickness, for example, in the range from about 40 to 60 nm. The top surface of the tungsten silicide layer 47 is irregular depending on the height of the bottom surface thereof. The polysilicon layer 46 and the tungsten silicide layer 47 function as control gates. A silicon nitride film 48 is formed on the tungsten silicide layer 47, having the thickness of about 100 nm, for example.

For example, the width of each concave section 6 in the device-isolation region is about 100 nm, the thickness of the gate-to-gate insulating film 45 is about 20 nm and the width of the polysilicon layer 46 filled in each concave section 6 is about 60 nm. The structure at the floating-gate lower corners shown in FIG. 33 is the same as the first embodiment shown in FIG. 3B.

Shown in FIG. 34 is a sectional view taken on line "C-D" of FIG. 2, in this embodiment. The gate oxide film 42 has been formed over the semiconductor substrate 5. Formed on gate-forming regions on the gate oxide film 42 are multi-layered gate electrodes 49, each made of the floating gate made of the first and the second polycrystalline silicon layers 43 and 44, the gate-to-gate insulating film 45, the polycrystalline silicon layer 46, the tungsten silicide layer 47 and the silicon nitride film 48. Although not shown, source/drain impurity regions of each transistor have been formed near the surface of the semiconductor substrate 5 between adjacent multi-layered gate electrodes 49.

A gate width M for each multi-layered gate electrode 49 is, for example, in the range from about 150 to 170 nm. A space N between adjacent multi-layered gate electrodes 49 is also, for example, in the range from about 150 to 170 nm.

This embodiment of semiconductor memory device has the same advantages as the first embodiment.

Disclosed next is a method of producing the semiconductor memory device of this embodiment according to the present invention. A feature of this method lies in a process to form a tunnel oxide film and a polycrystalline silicon film becoming a part of each floating gate, before formation of device-isolation regions. This process is called a floating-gate forming-in-advance process hereinafter.

The disclosure starts with FIG. 33 and FIGS. 35 to 57 for the semiconductor memory device in section taken on line "A-B" of FIG. 2.

Figure 35:
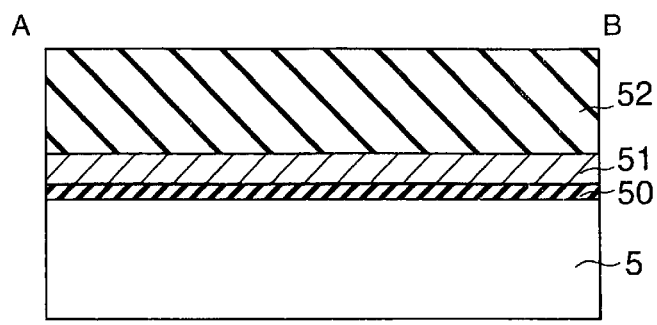
FIGS. 35 to 54 are sectional views, taken on line "A-B" of FIG. 2 illustrating the memory cells, each illustrating a process of a method of producing the semiconductor memory device of the second embodiment according to the present invention.

As shown in FIG. 35, a silicon thermal oxide film 50 of about 10 nm in thickness for example, is formed by dry oxidation on the semiconductor substrate 5, for example, a silicon substrate. The silicon thermal oxide film 50 will be processed into the gate oxide film 42 functioning as a tunnel oxide film in later stage. A first polycrystalline silicon layer 51 of about 50 nm in thickness for example, is deposited by LP-CVD on the silicon thermal oxide film 50. The first polycrystalline silicon layer 51 has been doped with phosphorous as impurities and will be processed into a part of each floating gate.

A silicon nitride film 52 of about 300 nm in thickness for example, is deposited by LP-CVD on the first polycrystalline silicon layer 51. The silicon nitride film 52 will function as a masking material for forming trenches on the semiconductor substrate 5 and also as a CMP stopper.

Figure 36:
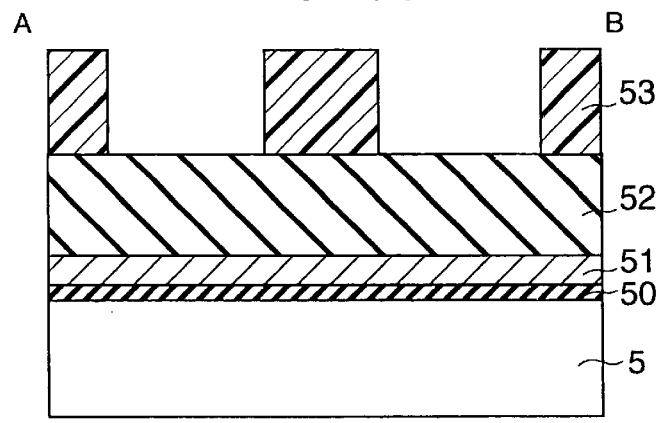

Next, as shown in FIG. 36, the entire device surface is covered with a photoresist 53 of about 600 nm in thickness for example. The photoresist 53 is then processed, by lithography, into a specific device-isolation pattern, to expose a part of the silicon nitride film 52.

Figure 37:
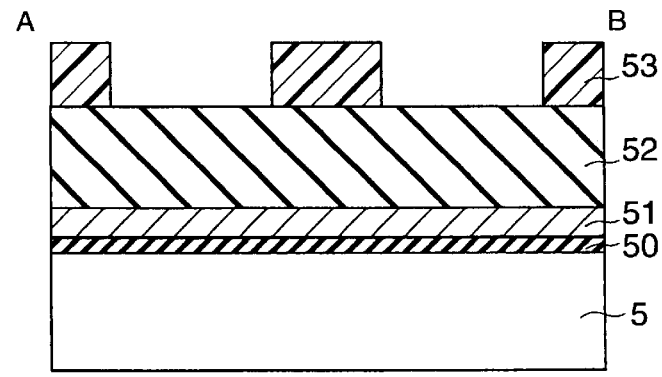
Figure 38:
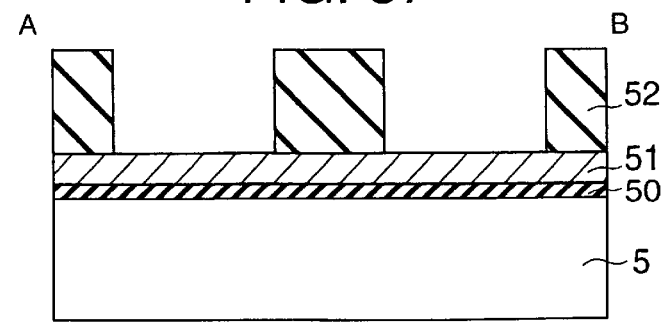

The silicon nitride film 52 is processed as shown in FIG. 37 by RIE with the photoresist 53 as a mask and the first polycrystalline silicon layer 51 as a stopper, to expose a part of the first polycrystalline silicon layer 51. The photoresist 53 is then removed by ashing, as shown in FIG. 38, to expose the first polycrystalline silicon layer 51.

Figure 39:
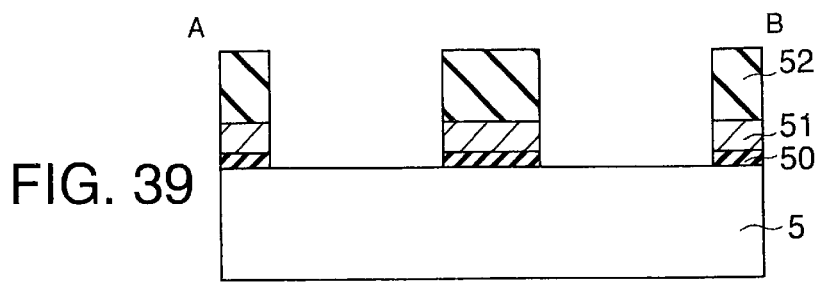

The first polycrystalline silicon layer 51 is processed as shown in FIG. 39 by RIE with the silicon nitride film 52 as a mask and the silicon thermal oxide film 50 as a stopper. Likewise, the silicon thermal oxide film 50 is processed by RIE with the silicon nitride film 52 as a mask and the semiconductor substrate 5 as a stopper, to expose a part of the semiconductor substrate 5.

Figure 40:
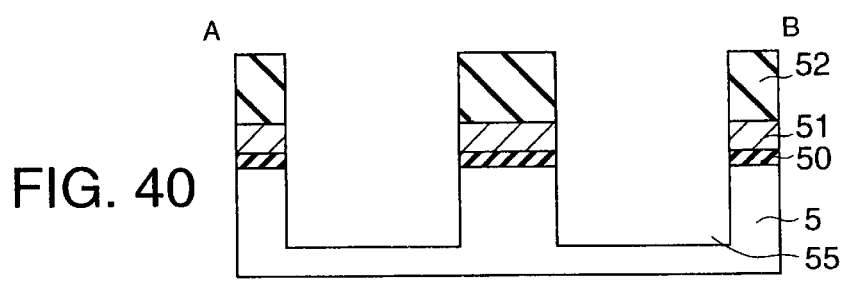
Figure 41:
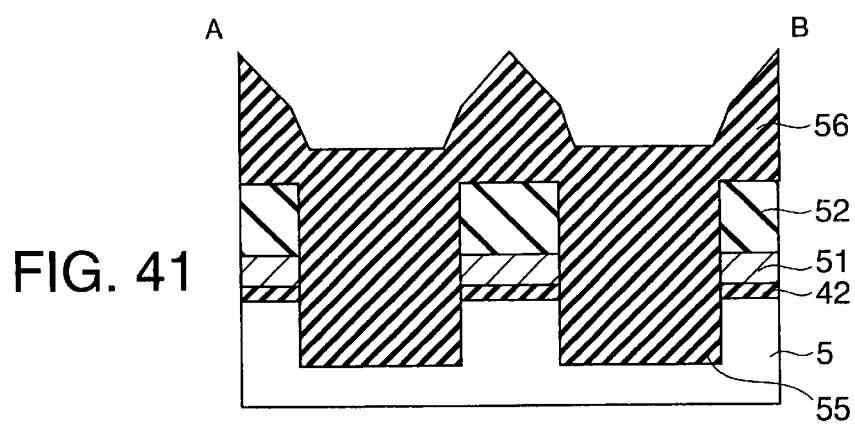

The semiconductor substrate 5 is processed as shown in FIG. 40 by RIE with the silicon nitride film 52 as a mask, to provide grooves 55 of about 250 nm in depth for example, as device-isolation regions. Next, as shown in FIG. 41, the grooves 55 are filled with a CVD silicon oxide film 56 deposited over the entire device surface at about 700 nm in thickness for example, thus the silicon thermal oxide film 50 being processed into the gate oxide film 42.

Figure 42:
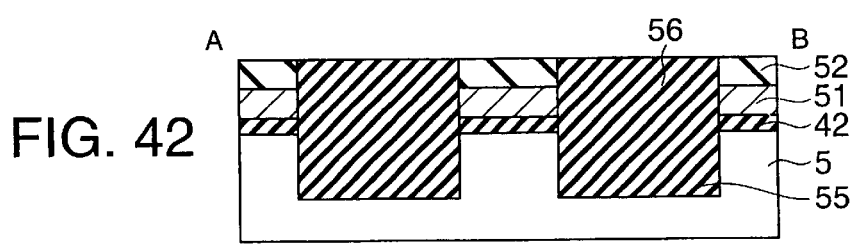

The CVD silicon oxide film 56 is polished into flat by CMP, as shown in FIG. 42. In detail, CMP is performed with the silicon nitride films 52 as a stopper, followed by thermal processing in nitrogen ambient to provide dense CVD silicon oxide films 56.

Figure 43:
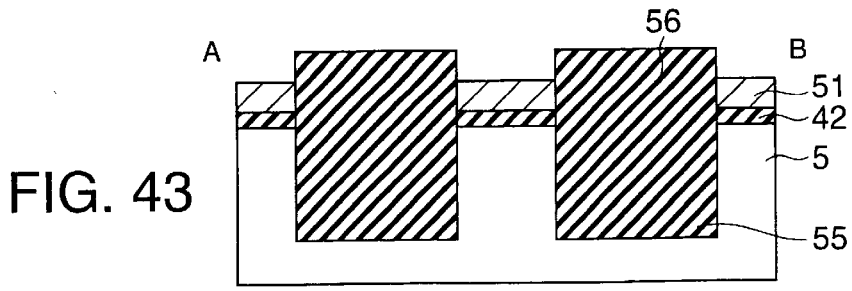
Figure 44:
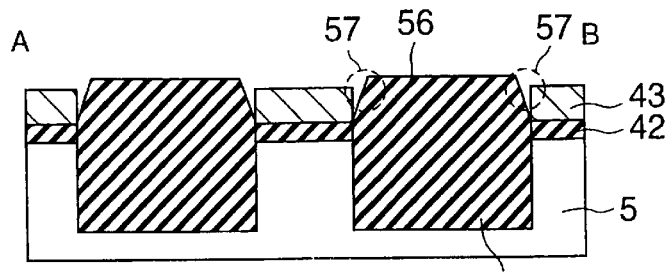

The silicon nitride films 52 are removed by wet etching as shown in FIG. 43, to expose the first polycrystalline silicon layers 51. Next, as shown in FIG. 44, the CVD silicon oxide films 56 are etched by isotropic wet etching at about 20 nm in thickness, for example, in both vertical and horizontal directions, to have round corners at upper edges 57, with the first polycrystalline silicon layers 51 being processed into the first polycrystalline silicon layers 43. This process is to minimize the steps of the CVD silicon oxide films 56, which have been formed due to removal of the silicon nitride film 52 in the former stage.

Figure 45:
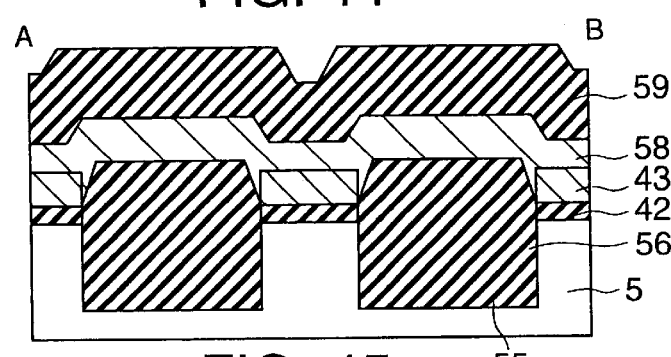

A second polycrystalline silicon layer 58 doped with phosphorous as impurities is deposited, by LP-CVD, over the entire device surface at about 100 nm for example, as shown in FIG. 45. The second polycrystalline silicon layer 58 and the first polycrystalline silicon layer 43 will be processed into floating gates in later stage. Deposited further by LP-CVD over the entire device surface is a CVD silicon oxide film 59 of about 200 nm in thickness for example. The CVD silicon oxide film 59 will be used as a masking material for processing the second polycrystalline silicon layer 58.

Figure 46:
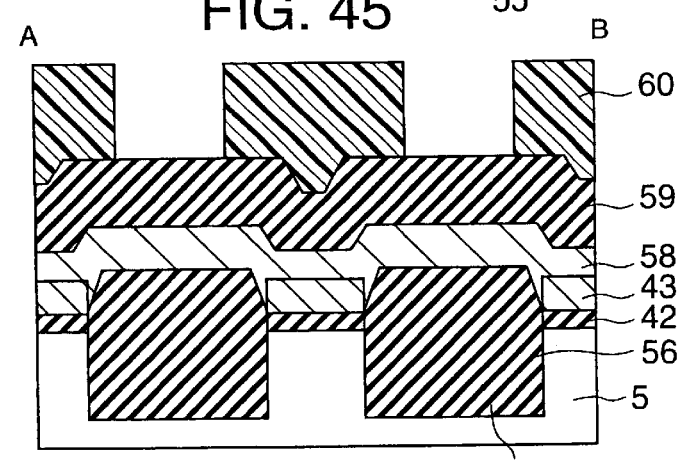

Next, as shown in FIG. 46, the entire device surface is covered with a photoresist 60 of about 600 nm in thickness for example. The photoresist 60 is then processed, by lithography, into a specific floating-gate pattern, to expose a part of the CVD silicon oxide film 59.

Figure 47:
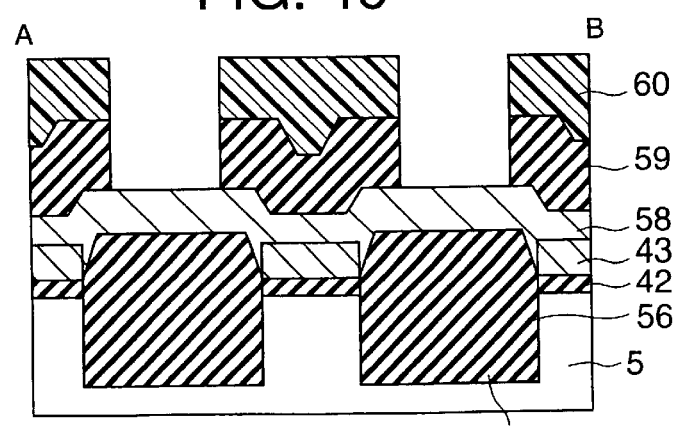
Figure 48:
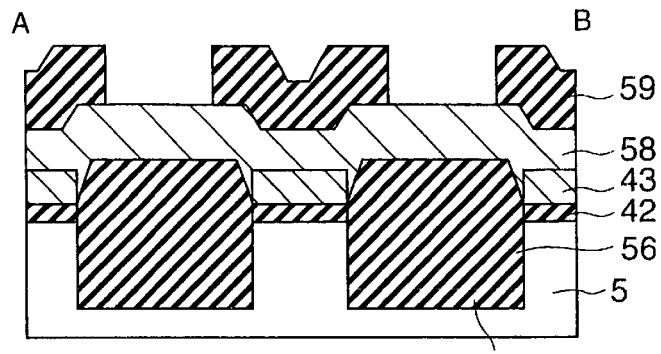

The CVD silicon oxide film 59 is processed as shown in FIG. 47 by RIE with the photoresist 60 as a mask and the second polycrystalline silicon layer 58 as a stopper. The photoresist 60 is removed by ashing to expose the CVD silicon oxide films 59, as shown in FIG. 48.

Figure 49:
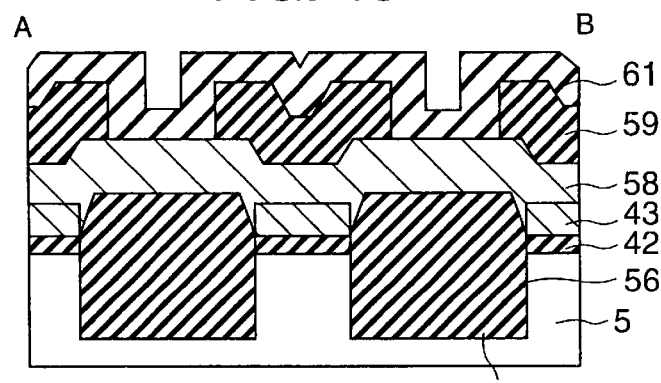
Figure 50:
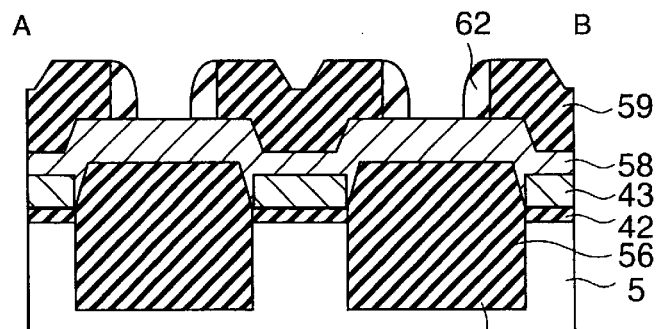

A CVD silicon oxide film 61 is then deposited by LP-CVD over the entire device surface at about 50 nm thickness for example, as shown in FIG. 49. Next, as shown in FIG. 50, the CVD silicon oxide film 61 is processed by RIE with the second polycrystalline silicon layer 58 as a stopper to form CVD silicon-oxide-film side walls 62 on the side faces of the CVD silicon oxide films 59.

Figure 51:
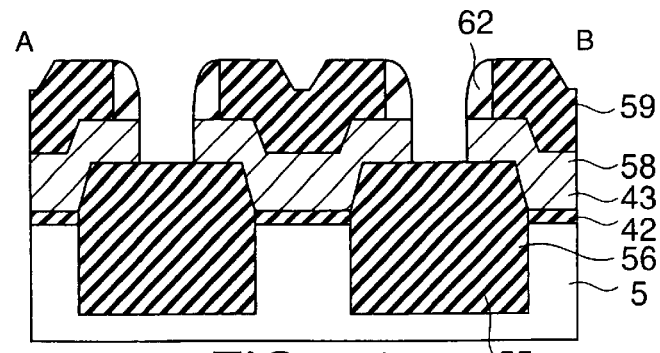

Next, as shown in FIG. 51, the second polycrystalline silicon layer 58 is processed by RIE with the CVD silicon oxide films 56 as a stopper to expose a part of each CVD silicon oxide film 56.

Figure 52:
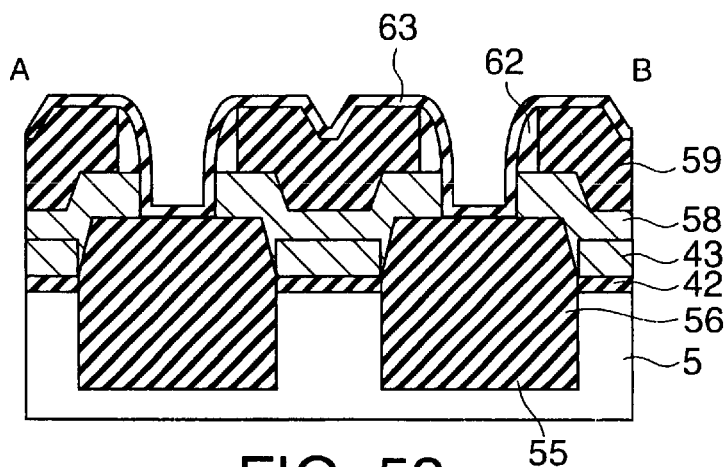

Next, as shown in FIG. 52, a CVD silicon oxide film 63 is deposited at about 20 nm in thickness for example by LP-CVD over the exposed entire surface of the CVD silicon oxide films 56, the second polycrystalline silicon layers 58, the CVD silicon oxide films 59 and the CVD silicon-oxide-film side walls 62.

Figure 53:
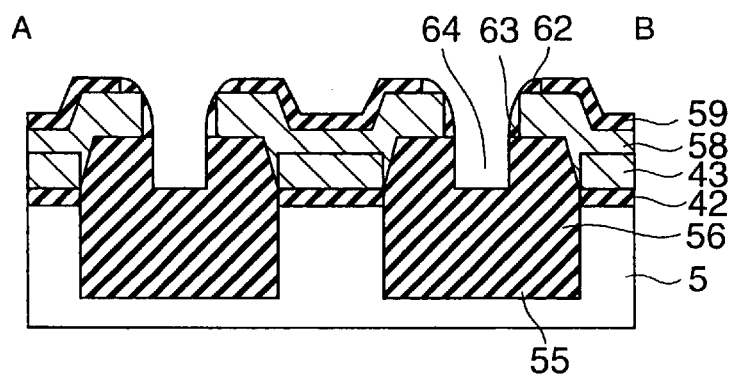

The CVD silicon oxide films 63 and 56 and also the CVD silicon-oxide-film side walls 62 are processed by RIE to provide grooves 64 at about 50 nm in depth and about 80 nm in width for example, as shown in FIG. 53. The bottom surface of each groove 64 is lower than the bottom surface of each first polycrystalline silicon layer 43. The remaining CVD silicon oxide film 63 has about 10 nm in thickness for example. The CVD silicon oxide films 59, 62 and 63 are selectively removed by HF paper cleaning.

Figure 54:
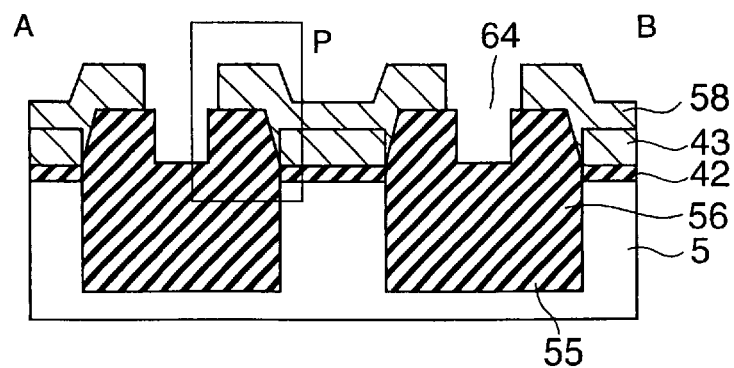
Figure 55:
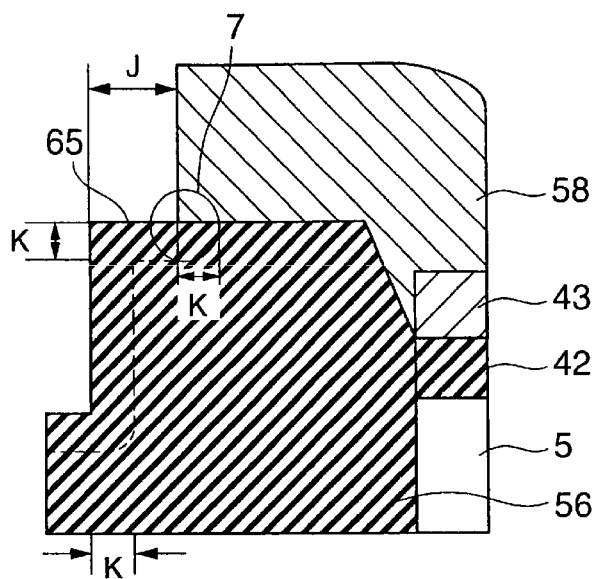
FIG. 55 is an enlarged sectional view of a block P in FIG. 54.

Illustrated in FIG. 55 is an enlarged sectional view of a block P indicated by a solid line for the peripherals of the edge of each second polycrystalline silicon layer 58 in FIG. 54. FIG. 55 shows a distance J between each groove 64 and the corresponding second polycrystalline silicon layer 58 due to the existence of the CVD silicon oxide film 63 in the former stage.

As shown in FIG. 55, the enlarged sectional view of each second polycrystalline silicon layer 58 on the top of the CVD silicon oxide film 56, the second polycrystalline silicon layer 58 is formed so that the distance J is larger than a width K of a region to be subjected to a hydrofluoric-acid applying process. The distance J is obtained at a rate higher than an etching rate K for the CVD silicon oxide film 56 with the hydrofluoric-acid applying process.

The distance J allows a dilute hydrofluoric-acid applying process to be performed before deposition of the gate-to-gate insulating films, as shown in FIG. 55. This process restricts isotropic etching by the etching rate K within an etched region, or a block 65 indicated by a dot line. The etched region 65 is removed by the dilute hydrofluoric-acid applying process to form the device-isolation region 1 and provide the depression 7 due to etching advanced on the upper edge of the region 1 in the lateral direction.

Metallic substances, if attached on an exposed part of the semiconductor memory device could cause crystal defects, low reliability, and so on. The buried surface is cleaned for preventing such phenomena by the hydrofluoric-acid applying process to enhance insulating property for the gate-to-gate insulating film 45.

The hydrofluoric-acid applying process is performed with oxide-film etching by thickness in the range from about 1 to 2 nm. The hydrofluoric-acid applying process promotes etching on the exposed surface of the CVD silicon oxide film 56 and also a region of the second polycrystalline layer 58, that faces the groove 64.

Figure 56:
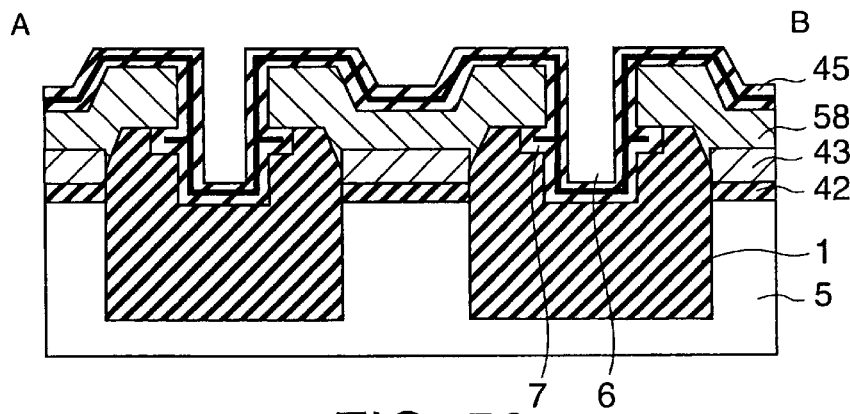
FIGS. 56 and 57 are sectional views, taken on line "A-B" of FIG. 2 illustrating the memory cells, each illustrating a process of a method of producing the semiconductor memory device of the second embodiment according to the present invention.

Next, as shown in FIG. 56, an ONO film is deposited by LP-CVD in each depression 7, as if being folded, as the gate-to-gate insulating film 45 of about 20 nm in total thickness. The gap for the floating gates is set, before ONO-film deposition, at a rate higher than the etching rate in the hydrofluoric-acid applying process. The ONO film is then filled in between the floating gates and the top surface of device-isolation region.

Figure 57:
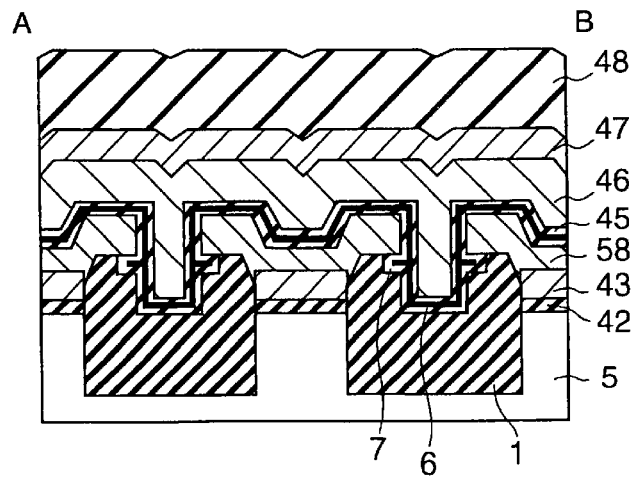

Next, as shown in FIG. 56, an ONO film is deposited by LP-CVD as the gate-to-gate insulating film 45 of about 20 nm in total thickness. Next, as shown in FIG. 57, the polycrystalline silicon layer 46 with phosphorous as impurities is deposited by LP-CVD over the entire device surface at about 100 nm in thickness for example. The tungsten silicide layer 47 having about 50 nm, for example, in thickness is then formed by sputtering on the polycrystalline silicon layer 46. The polycrystalline silicon layer 46 and the tungsten silicide layer 47 will be processed into control gates in later stages. The silicon nitride film 48 of about 200 nm in thickness is deposited by LP-CVD on the tungsten silicide layer 47.

Figure 58:
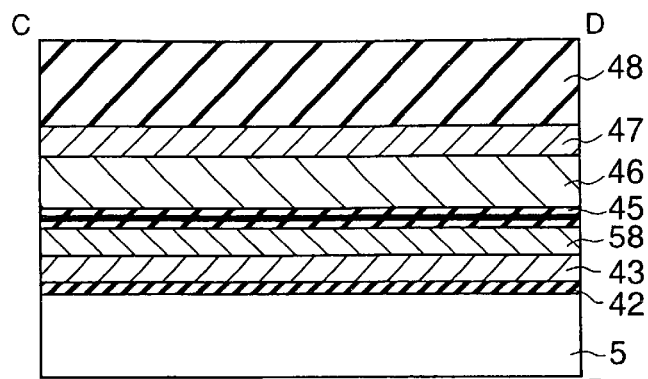
FIGS. 58 to 61 are sectional views, taken on line "C-D" of FIG. 2 illustrating the memory cells, each illustrating a process of a method of producing the semiconductor memory device of the second embodiment according to the present invention.

Disclosed next is a method of producing the semiconductor memory device with respect to FIG. 34 and also FIGS. 58 to 61, the sectional views taken on line "C-D" of FIG. 2. FIG. 58 shows a sectional view taken on line "C-D" of FIG. 2, in the process illustrated in FIG. 57.

Illustrated in FIG. 58 are the gate oxide film 42, the first polycrystalline silicon layer 43, the second polycrystalline silicon layer 44, the gate-to-gate insulating film 45, the polycrystalline silicon layer 46, the tungsten silicide layer 47 and the silicon nitride film 48, laminated in order on the semiconductor substrate 5.

Figure 59:
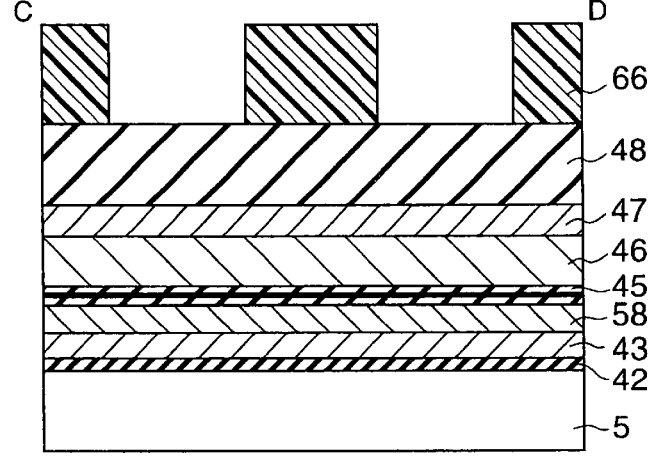
Figure 60:
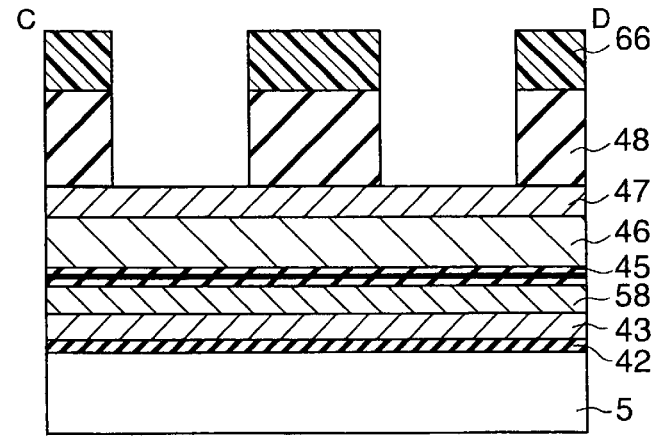
Figure 61:
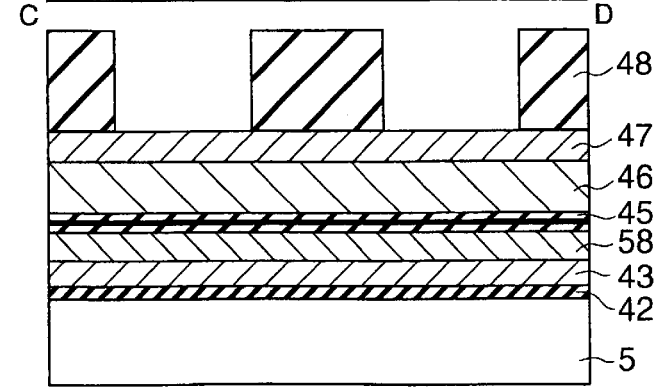

As shown in FIG. 59, a photoresist 66 is applied over the entire device surface at about 600 nm in thickness for example, and then processed into a specific gate pattern by lithography. The silicon nitride film 48 is processed by RIE with the photoresist 66 as a mask to expose the tungsten silicide layer 47 to the openings, as shown in FIG. 60. The photoresist 66 is then removed by ashing to expose the silicon nitride films 48, as shown in FIG. 61.

The tungsten silicide layer 47, the polycrystalline silicon layer 46, the gate-to-gate insulating film 45, the second polycrystalline silicon layer 44 and the first polycrystalline silicon layer 43 are processed by RIE with the silicon nitride film 48 as a mask to form each specific gate structure, as shown in FIG. 34.

The second polycrystalline silicon layer 44 and the first polycrystalline silicon layer 43 are etched at a high selectivity to the gate oxide film 42 to leave the film 42 on the semiconductor substrate 5.

Oxidation is then performed for device recovery from damages due to attacks of plasma and ion injected into the semiconductor substrate and gate oxide film edges and also crystallization of the tungsten silicide layer 47 for lowering resistance.

Although not shown for the subsequent process stages, a diffusion layer is formed and then a inter-layer film is deposited over the entire device surface, followed by contact and wiring formation, to produce a MISFET.

This embodiment of production method has advantages the same as the first embodiment. Moreover, this embodiment allows formation of floating gates before device-isolation regions, preventing generation of depressions, which may otherwise occur between device regions and device-isolation regions, for enhanced reliability.

The first and second embodiments can be applied to non-volatile semiconductor memory devices having floating gates, such as flash memories.

As disclosed above, the present invention provides semiconductor memory devices and their production methods, which can restrict convergence of electric field to the gate-to-gate insulating film at the floating-gate corners, to relieve voltage breakdown and leak current which otherwise occur to the gate-insulating film due to convergence of electric field, for enhanced reliability and yielding.

What is claimed is:

1. A semiconductor memory device having at least one floating gate comprising:

a semiconductor substrate;

at least one device-isolation region buried in the semiconductor substrate, having a top surface protruding from a top surface of the semiconductor substrate, the top surface of the device-isolation region having a concave section that has a depression thereon;

at least one gate-insulating film formed on the semiconductor substrate;

a first gate formed on the gate-insulating film, the device-isolation region and the depression;

a gate-to-gate insulating film formed on the first gate and in the concave section and the depression of the device-isolation region; and a second gate formed on the gate-to-gate insulating film, the depression being filled with the second gate, wherein a distance between first side walls of the gate-to-gate insulating film corresponding to the first gate above the depression is larger than a distance between second side walls of the gate-to-gate insulating film corresponding to the concave section below the depression.

2. The semiconductor memory device according to claim 1, wherein the first gate is a floating gate, the second gate is a control gate and the gate-to-gate insulating film is an ONO insulating film.

3. The semiconductor memory device according to claim 1, wherein the concave section on the top surface of the device-isolation region is lower than the top surface of the semiconductor substrate.

4. A semiconductor memory device having floating gates comprising:

a semiconductor substrate;

at least one device-isolation region buried in the semiconductor substrate, having a top surface protruding from a top surface of the semiconductor substrate, the top surface of the device-isolation region having a concave section that has a depression thereon;

at least one gate-insulating film formed on the semiconductor substrate;

a plurality of first gates formed on the gate-insulating film, the device isolation region and the depression, the first gates being isolated from each other on the device-isolation region;

a gate-to-gate insulating film formed on the first gates and in the concave section and the depression of the device isolation region, the first gates being isolated from each other by the gate-to-gate insulating film; and a second gate formed on the gate-to-gate insulating film, the depression being filled with the second gate, wherein a distance between first side walls of the gate-to-gate insulating film corresponding to the first gates above the depression is larger than a distance between second side walls of the gate-to-gate insulating film corresponding to the concave section below the depression.

5. A semiconductor memory device according to claim 4, wherein the device-isolation region is formed such that a bottom surface of the second gate formed in a region, via which the first gates are isolated from each other on the device-isolation region, is lower than a surface of each first gate touching the top surface of the device-isolation region.

6. A semiconductor memory device according to claim 4, wherein the distance between the second gate and the gate insulating film is greater than the distance between the second gate and the first gates.

7. The semiconductor memory device according to claim 4, wherein each first gate is a floating gate, the second gate is a control gate and the gate-to-gate insulating film is an ONO insulation film.

8. The semiconductor memory device according to claim 7 further comprising a silicon nitride film formed in the depression of the device-isolation region under the first gates, the silicon nitride film being thicker than the ONO film on the first gates.

9. The semiconductor memory device according to claim 4, wherein the concave section on the top surface of the device-isolation region is lower than the top surface of the semiconductor substrate.

10. The semiconductor memory device according to claim 4, wherein each first gate has a first polycrystalline silicon layer, having no impurities doped, formed on the gate insulating film and a second polycrystalline silicon layer, having impurities doped, formed on the first polycrystalline silicon layer.

* * * * *